United States Patent

Kaneda et al.

(10) Patent No.: US 10,692,922 B2
(45) Date of Patent: Jun. 23, 2020

(54) PHOTOELECTRIC CONVERSION DEVICE, METHOD OF MANUFACTURING THE SAME, AND EQUIPMENT

(71) Applicant: CANON KABUSHIKI KAISHA, Tokyo (JP)

(72) Inventors: Tasuku Kaneda, Kawasaki (JP); Toshihiro Shoyama, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 42 days.

(21) Appl. No.: 16/196,389

(22) Filed: Nov. 20, 2018

(65) Prior Publication Data

US 2019/0165034 A1 May 30, 2019

(30) Foreign Application Priority Data

Nov. 28, 2017 (JP) ................. 2017-228308

(51) Int. Cl.
*H01L 27/146* (2006.01)
*H04N 5/378* (2011.01)
(Continued)

(52) U.S. Cl.
CPC .... *H01L 27/14698* (2013.01); *H01L 27/1463* (2013.01); *H01L 27/14612* (2013.01);
(Continued)

(58) Field of Classification Search
CPC ........... H01L 51/4233; H01L 29/66969; H01L 29/4908; H01L 21/02422; H01L 51/4273;
(Continued)

(56) References Cited

U.S. PATENT DOCUMENTS

2005/0127415 A1* 6/2005 Yuzurihara ....... H01L 27/14603
257/292
2008/0036019 A1* 2/2008 Tamura ............ H01L 27/14601
257/431

(Continued)

FOREIGN PATENT DOCUMENTS

JP 2016-119411 A 6/2016
JP 2016-171177 A 9/2016
JP 2017-130626 A 7/2017

*Primary Examiner* — Lin Ye
*Assistant Examiner* — Tuan H Le
(74) *Attorney, Agent, or Firm* — Venable LLP

(57) ABSTRACT

A photoelectric conversion device includes photoelectric converter arranged in semiconductor substrate made of silicon and is and transistor arranged on surface of the substrate. The photoelectric converter includes first region of a first conductivity type, configured to accumulate charges, and second region of second conductivity type. The first region is arranged between the surface and the second region. The substrate includes third region as source and/or drain of the transistor. The substrate includes, in position which is below the third region and is apart from the third region, impurity region containing group 14 element other than silicon. Depth from the surface of peak position in density distribution of the group 14 element in the impurity region is smaller than depth from the surface of peak position in density distribution of majority carrier in the second region.

21 Claims, 17 Drawing Sheets

(51) Int. Cl.
  *G06T 7/50* (2017.01)
  *B60W 30/095* (2012.01)
(52) U.S. Cl.
  CPC ....... *H01L 27/14689* (2013.01); *H04N 5/378* (2013.01); *B60W 30/095* (2013.01); *B60W 2420/42* (2013.01); *B60W 2554/801* (2020.02); *G06T 7/50* (2017.01); *G06T 2207/30261* (2013.01); *H01L 27/14641* (2013.01)
(58) Field of Classification Search
  CPC ............... H01L 21/02554; H01L 29/24; H01L 21/02628; H01L 21/02565; H01L 29/7869; H01L 2251/308; H01L 2251/303; H01L 31/0288; H01L 21/02658; H01L 21/02532; H01L 21/02381; H01L 31/103; H01L 27/146; H01L 21/04; H01L 21/0415; H01L 21/203; H01L 27/14698; H01L 27/14612; H01L 27/14689; H01L 27/1463; H01L 27/14641; C09D 11/52; Y02P 70/521; Y02E 10/549; H04N 5/378; H04N 5/369; H04N 5/367; B60W 2554/801; B60W 2420/42; B60W 30/095; G06T 2207/30261; G06T 7/50
  See application file for complete search history.

(56) References Cited

U.S. PATENT DOCUMENTS

| | | | |
|---|---|---|---|
| 2010/0140668 A1* | 6/2010 | Stevens | H01L 27/1463 257/225 |
| 2010/0267184 A1* | 10/2010 | Noh | H01L 21/26506 438/58 |
| 2012/0085888 A1* | 4/2012 | Endo | H01L 27/14609 250/208.1 |
| 2012/0267747 A1* | 10/2012 | Watanabe | H01L 27/14609 257/443 |
| 2015/0334328 A1* | 11/2015 | Iida | H01L 27/14607 348/297 |
| 2016/0064429 A1* | 3/2016 | Iida | H01L 27/1461 348/311 |
| 2016/0284757 A1* | 9/2016 | Kaneda | H01L 27/14643 |
| 2016/0284758 A1* | 9/2016 | Hirota | H01L 27/14643 |
| 2016/0365462 A1* | 12/2016 | Shoyama | H01L 21/3225 |
| 2017/0213862 A1 | 7/2017 | Kamino et al. | |
| 2018/0166591 A1 | 6/2018 | Shoyama et al. | |

\* cited by examiner

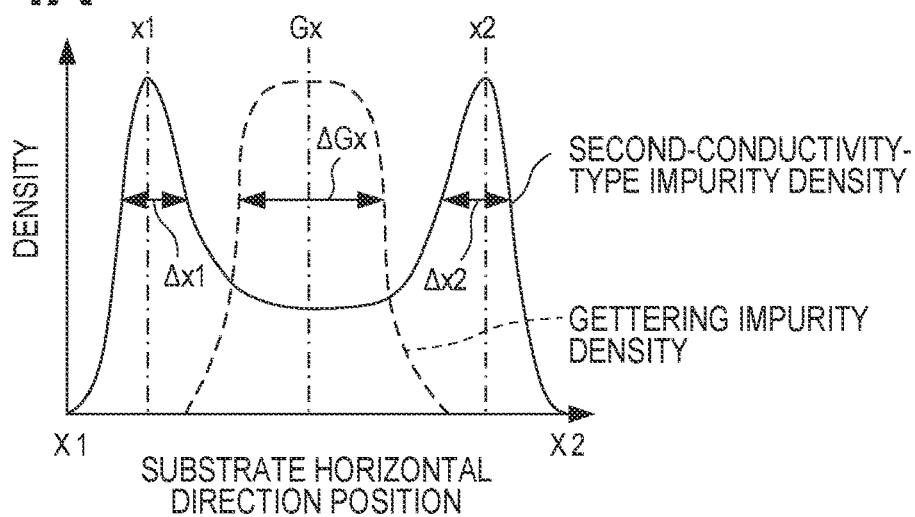
FIG. 4A  X1-X2 SECTION DENSITY DISTRIBUTION
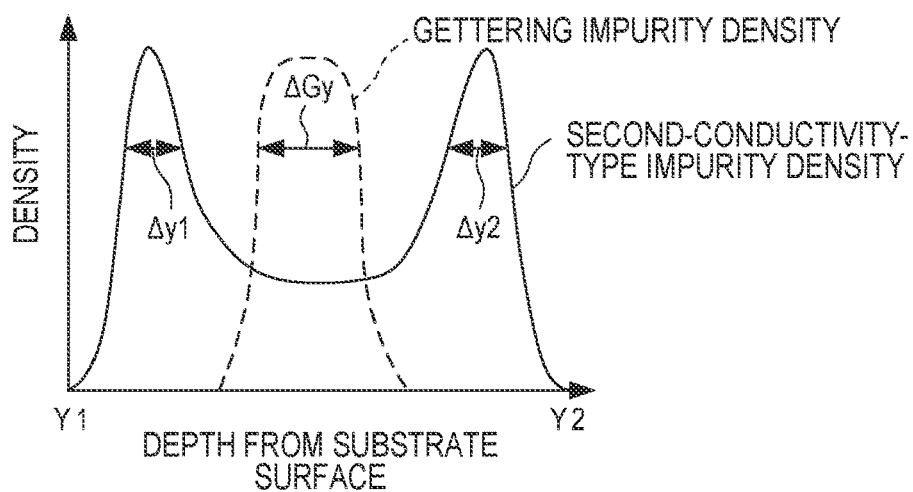
FIG. 4B  Y1-Y2 SECTION DENSITY DISTRIBUTION
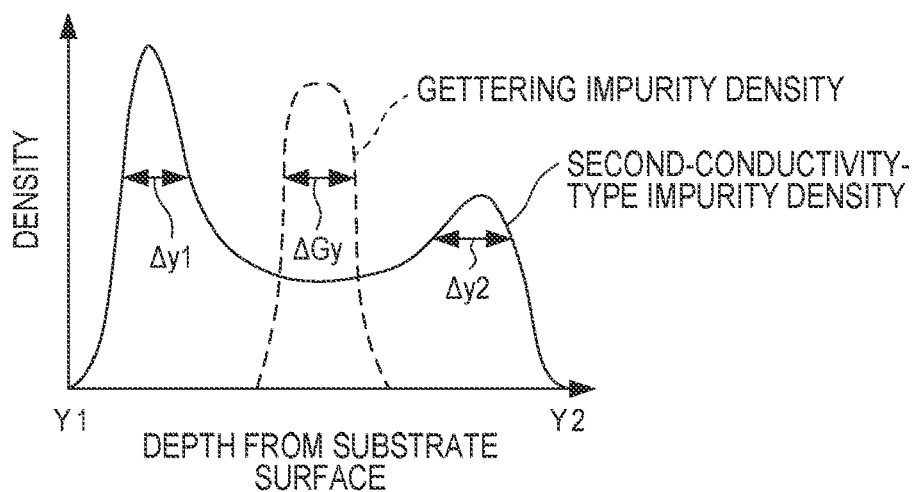
FIG. 4C  Y1-Y2 SECTION DENSITY DISTRIBUTION FIG. 12
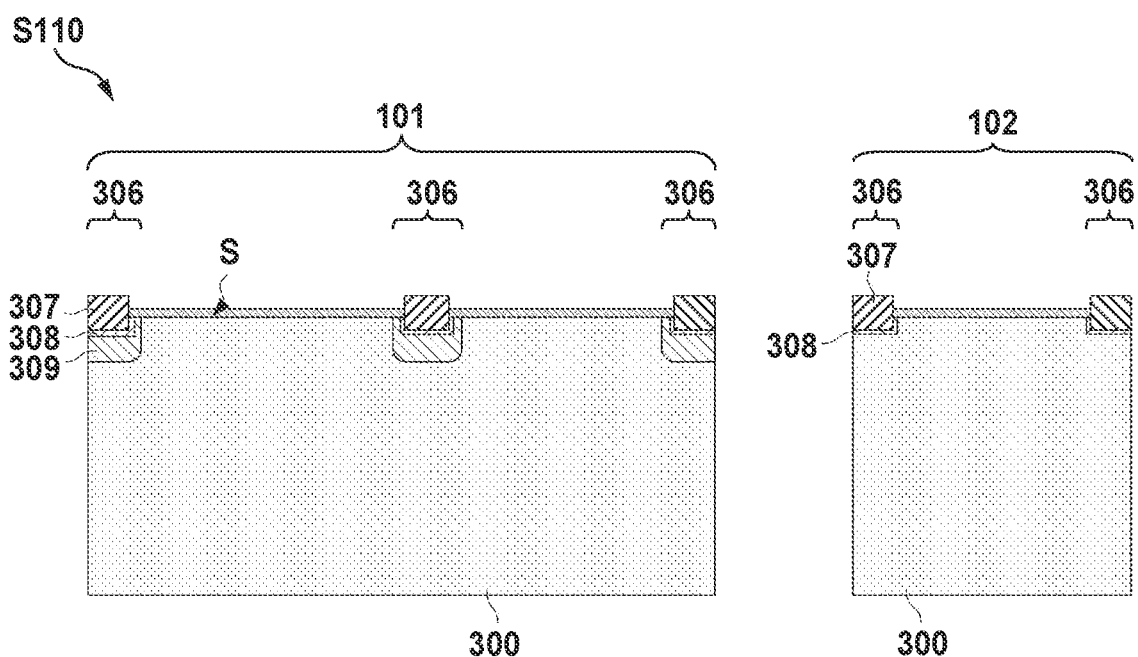
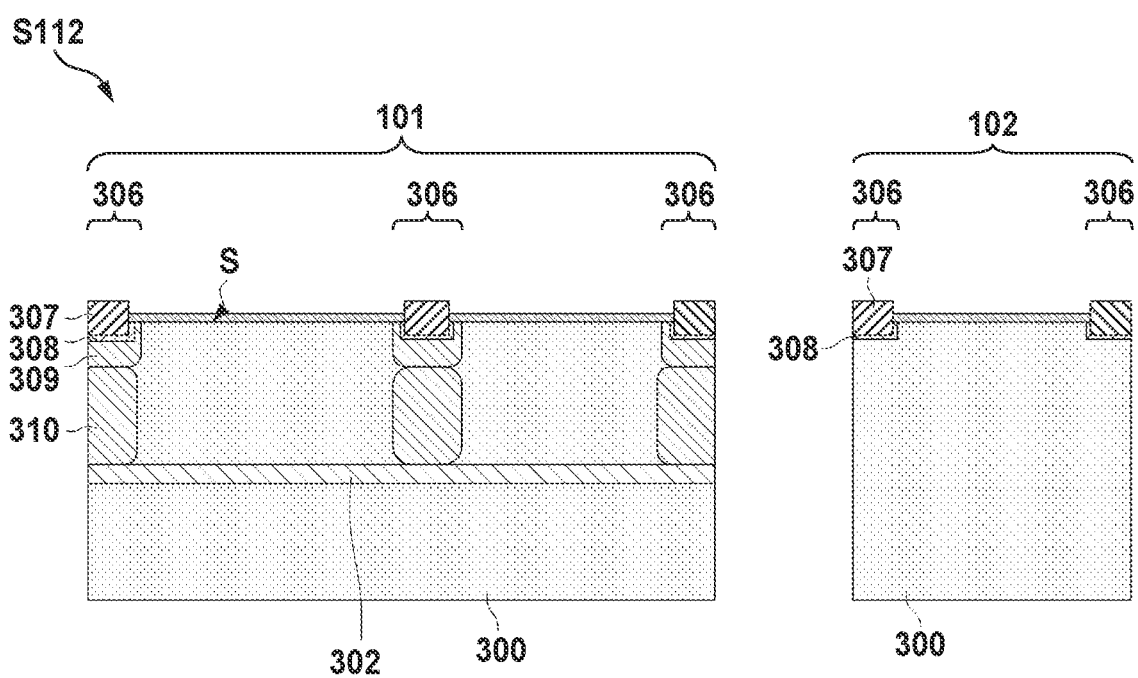

FIG. 13
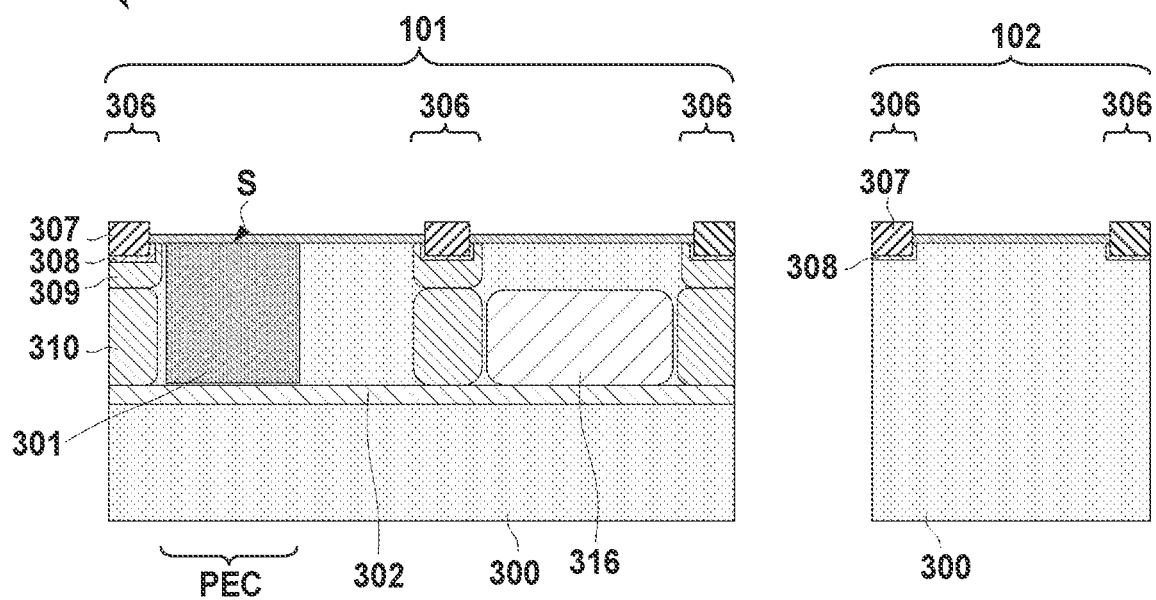
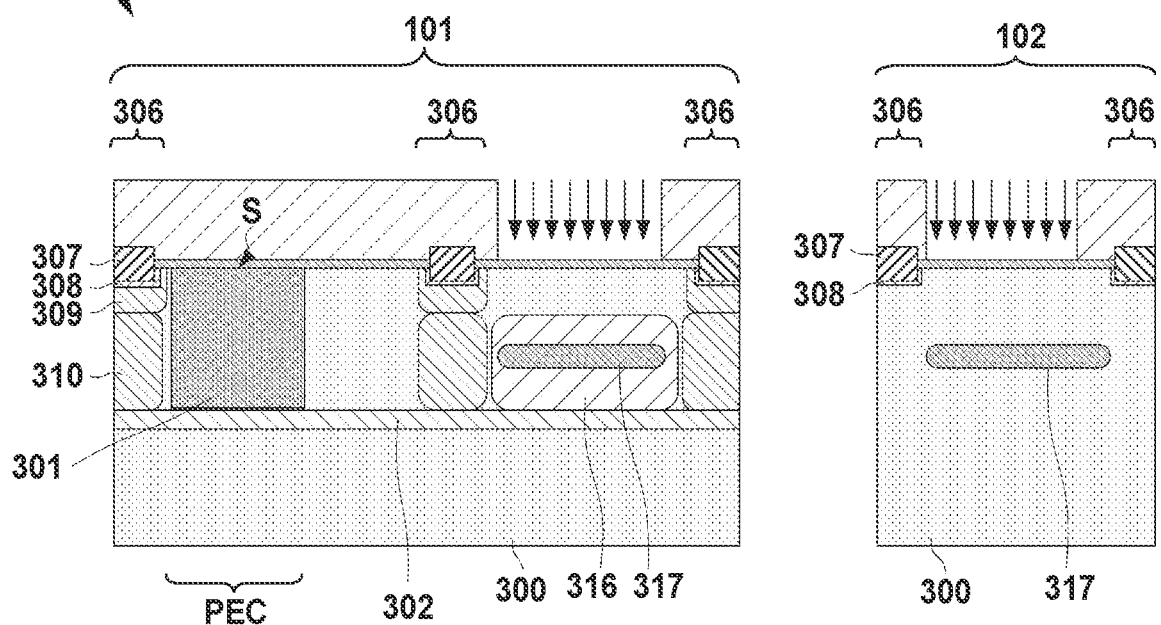

FIG. 14
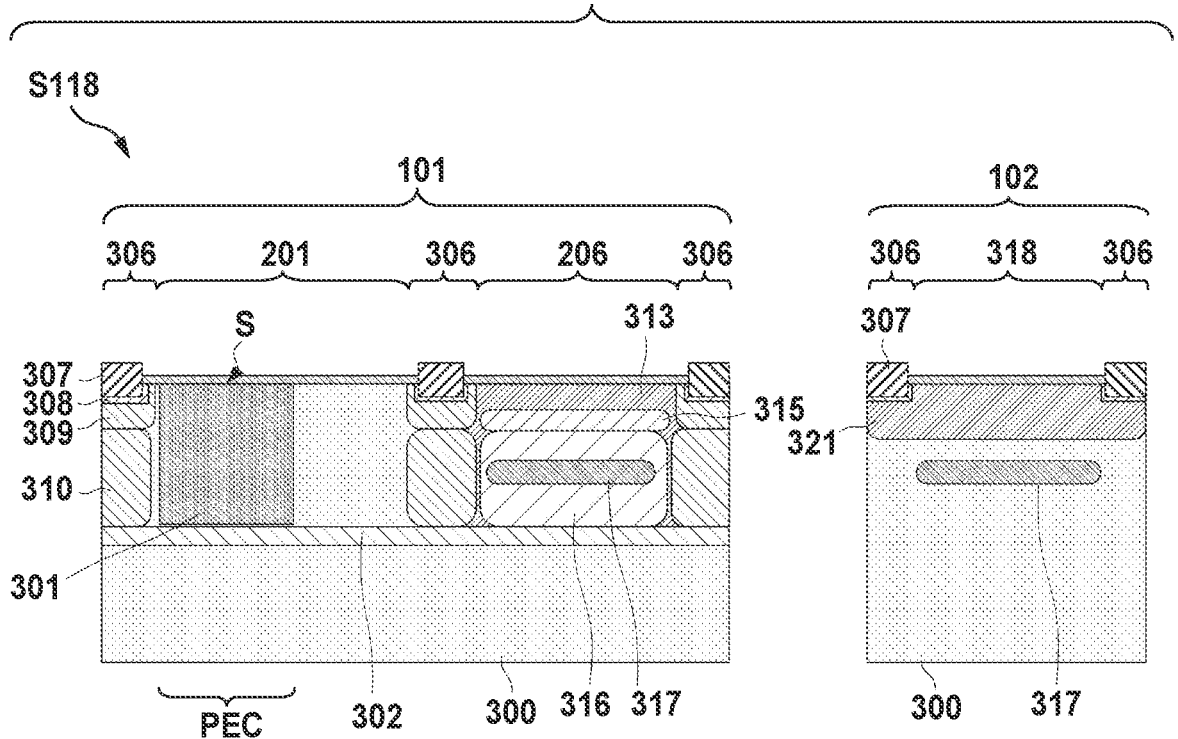
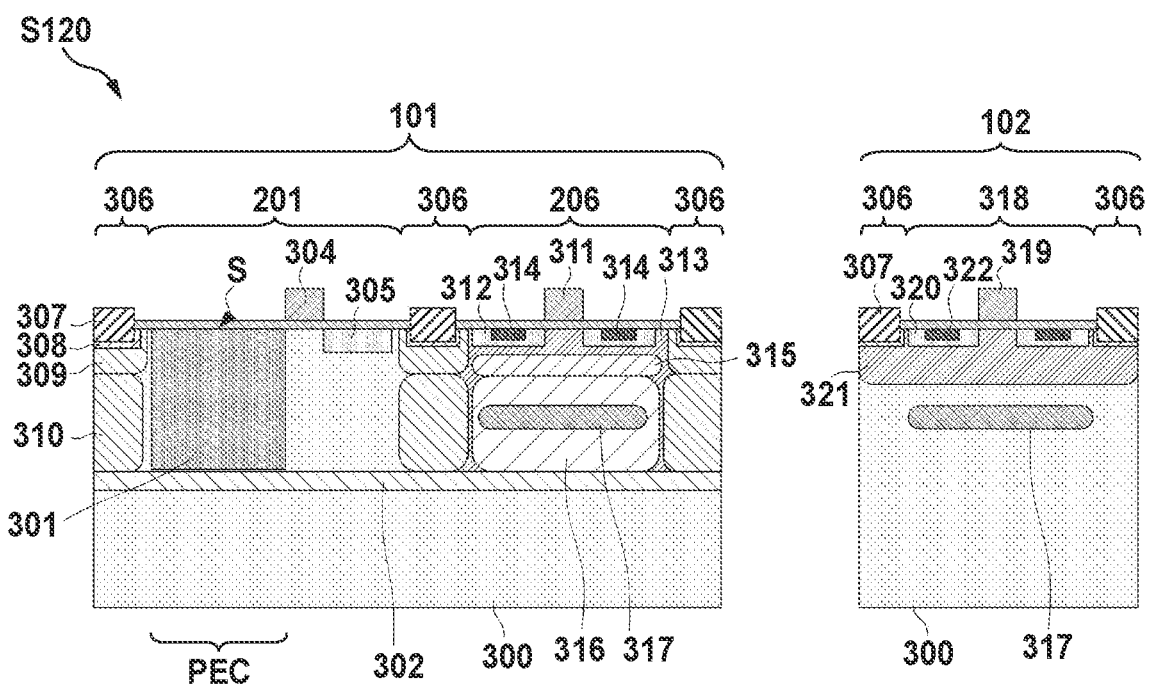

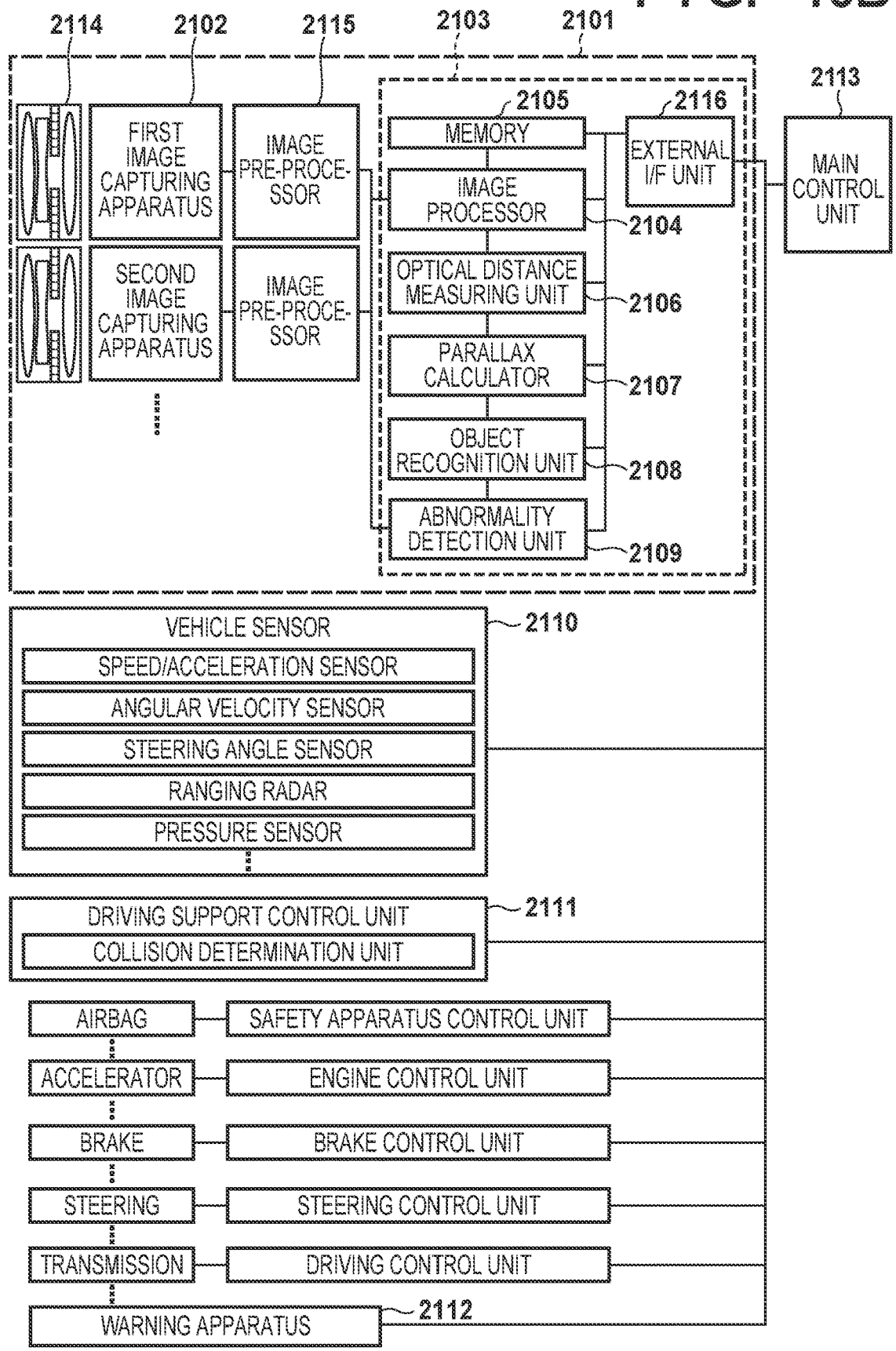

PHOTOELECTRIC CONVERSION DEVICE, METHOD OF MANUFACTURING THE SAME, AND EQUIPMENT

BACKGROUND OF THE INVENTION

Field of the Invention

The present invention relates to a photoelectric conversion device, a method of manufacturing the same, and an equipment.

Description of the Related Art

The pixel count, the sensitivity, and the functions of a solid-state image sensor are increasing. As one of the factors inhibiting the advancement of these elements, there is a problem called a white spot defect in a solid-state image sensor. A white spot defect can occur when a metal impurity mixes into a photoelectric converter of a pixel during the manufacturing process of a solid-state image sensor. In order to prevent a metal impurity from mixing into the photoelectric converter, there is a technique of forming a high-density defect layer in a semiconductor substrate by gettering the metal impurity by the defect layer during annealing in the manufacturing process.

Japanese Patent Laid-Open No. 2016-171177 discloses a CMOS image sensor which includes an n-type first epitaxial layer arranged on a semiconductor substrate and a second epitaxial layer arranged on the first epitaxial layer. A p-type well is formed in the second epitaxial layer, and a photoelectric conversion element is formed by the p-type well and an n-type semiconductor region provided inside the p-type well. A gettering layer is arranged in the first epitaxial layer. Japanese Patent Laid-Open No. 2016-171177 discloses only the positional relationship between the gettering layer and the photoelectric conversion element, among the photoelectric conversion element and a transistor which form a pixel. It is assumed, however, that normally the transistor will be formed in the second epitaxial layer arranged on the first epitaxial layer in which the gettering layer is arranged.

As a factor that causes the metal impurity to enter the photoelectric converter, the entry of the metal impurity to a substrate during an ion acceleration process, such as ion implantation, dry etching, and the like for forming a pixel region, can be considered. Thermal diffusion of a silicide-formation metal from a peripheral circuit region to the photoelectric converter of the pixel also can be considered as a factor that causes the metal impurity to enter the photoelectric converter. In the CMOS image sensor disclosed in Japanese Patent Laid-Open No. 2016-171177, the distance between (the source region and the drain region of) the transistor forming a pixel and the gettering layer positioned below the transistor can be considered to be long. Hence, in a case in which a metal impurity has entered the photoelectric conversion element via the transistor, it is difficult to effectively suppress the metal impurity from entering the photoelectric conversion element.

SUMMARY OF THE INVENTION

The present invention provides a technique advantageous in suppressing the generation of a dark current or a white spot defect.

A first aspect of the present invention provides a photoelectric conversion device, comprising: a photoelectric converter arranged in a semiconductor substrate made of silicon; and a transistor arranged on a surface of the semiconductor substrate, wherein the photoelectric converter includes a first region which is of a first conductivity type and is configured to accumulate charges and a second region of a second conductivity type different from the first conductivity type, and the first region is arranged between the surface and the second region, the semiconductor substrate includes a third region which functions as a source and/or a drain of the transistor, the semiconductor substrate includes, in a position which is below the third region and is apart from the third region, an impurity region containing a group 14 element other than silicon, and a depth from the surface, of a peak position in a density distribution of the group 14 element in the impurity region is smaller than a depth from the surface, of a peak position in a density distribution of a majority carrier in the second region.

A second aspect of the present invention provides a photoelectric conversion device that includes a photoelectric converter arranged in a semiconductor substrate and a transistor arranged on a surface of the semiconductor substrate, wherein the photoelectric converter includes a first region which is of a first conductivity type and is configured to accumulate charges and a second region of a second conductivity type different from the first conductivity type, and the first region is arranged between the surface and the second region, the semiconductor substrate includes a third region which functions as a source and/or a drain of the transistor, the semiconductor substrate includes, in a position which is below the third region and is apart from the third region, an impurity region containing carbon, and a depth from the surface, of a peak position of the density of the carbon in the impurity region falls within a range of 0.1 µm to 0.5 µm and is smaller than a depth from the peak position, of the peak position of the density of a majority carrier in the second region.

A third aspect of the present invention provides an equipment comprising: a photoelectric conversion device defined as the first or second aspect of the present invention; and a processing device configured to process a signal output from the photoelectric conversion device.

A fourth aspect of the present invention provides an equipment that includes a driving device, comprising: a control device which incorporates a photoelectric conversion device defined as the first or second aspect of the present invention, and is configured to control the driving device based on information obtained by the photoelectric conversion device.

A fifth aspect of the present invention provides a method of manufacturing a photoelectric conversion device that includes a photoelectric converter and a transistor, the photoelectric converter includes a first region which is of a first conductivity type and is configured to accumulate charges and a second region of a second conductivity type different from the first conductivity type, and the first region is arranged between a surface of a semiconductor substrate and the second region, the method comprising: implanting a group 14 element other than silicon to the semiconductor substrate and forming an impurity region containing the group 14 element in the semiconductor substrate; and forming a third region configured to function as a source or a drain of the transistor in the semiconductor substrate, wherein the impurity region is arranged in a position which is below the third region and is apart from the third region, and a depth from the surface, of a peak position of the density of the group 14 element in the impurity region is smaller than a depth from the surface, of the peak position of the density of a majority carrier in the second region.

Further features of the present invention will become apparent from the following description of exemplary embodiments with reference to the attached drawings.

BRIEF DESCRIPTION OF THE DRAWINGS

FIGS. 4A to 4C are graphs each exemplifying the density of a group 14 element other than silicon and the density (majority carrier density) of a second-conductivity-type (p-type) impurity in a first gettering region;

FIG. 12 is a view exemplifying a method of manufacturing the photoelectric conversion device according to the embodiment of the present invention;

FIG. 13 is a view exemplifying the method of manufacturing the photoelectric conversion device according to the embodiment of the present invention;

FIG. 14 is a view exemplifying the method of manufacturing the photoelectric conversion device according to the embodiment of the present invention;

FIGS. 16A and 16B are views showing the arrangement of a transportation equipment according to the embodiment of the present invention.

DESCRIPTION OF THE EMBODIMENTS

An exemplary embodiment of the present invention will be described hereinafter with reference to the accompanying drawings.

In this specification, a first conductivity type and a second conductivity type will be used as terms to discriminate the conductivity type of a semiconductor region. The first conductivity type and the second conductivity type are different conductivity types (conductivity types which are opposite to each other). For example, if the first conductivity type is the n-type, the second conductivity type will be the p-type, and if the first conductivity type is the p-type, the second conductivity type will be the n-type.

Figure 1:
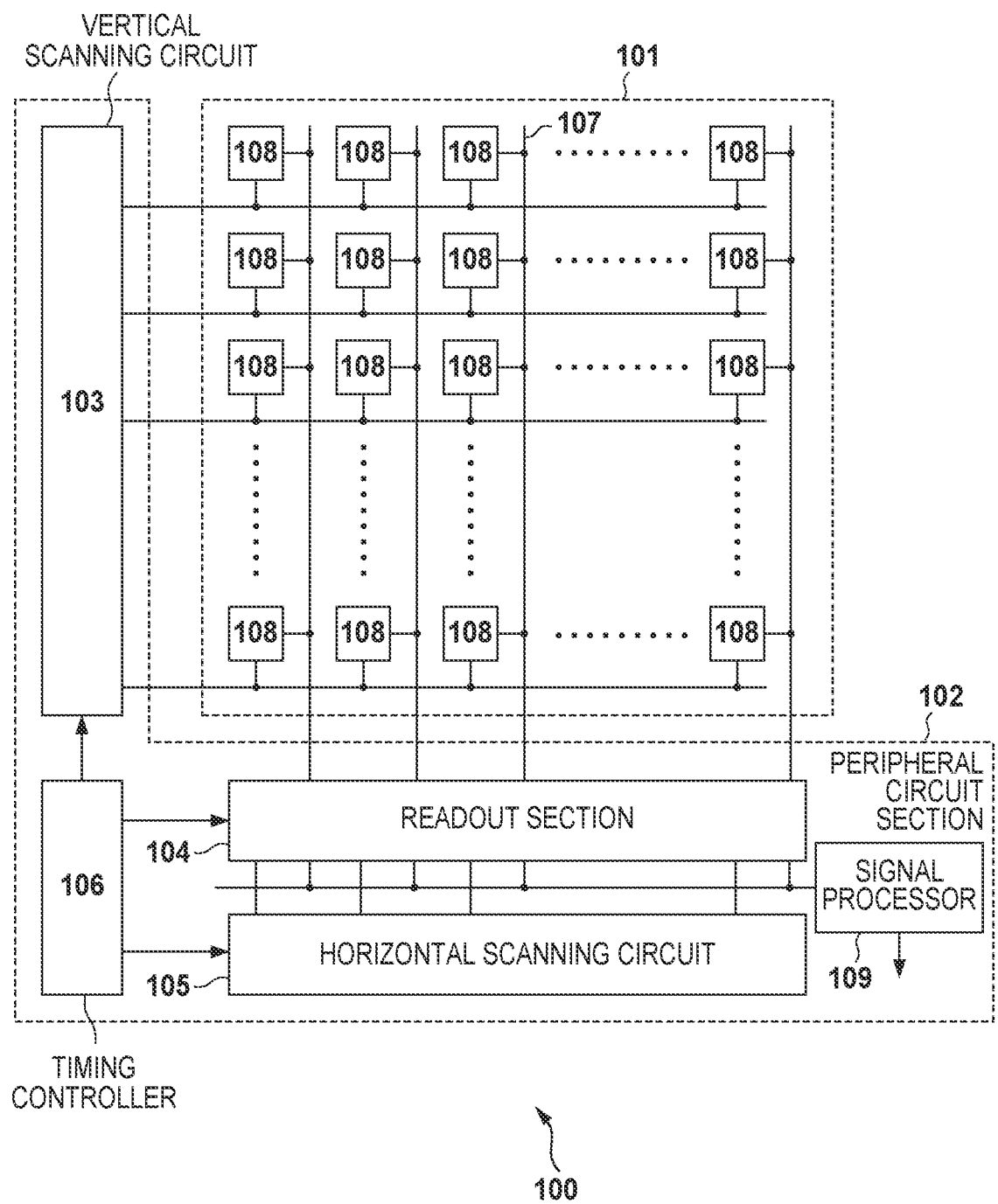
FIG. 1 is a schematic view showing the arrangement of a photoelectric conversion device according to an embodiment of the present invention.

FIG. 1 is a schematic view showing the arrangement of a photoelectric conversion device 100 according to an embodiment of the present invention. The photoelectric conversion device 100 includes a pixel section 101 and a peripheral circuit section 102 for reading out signals from the pixel section 101. The peripheral circuit section 102 can be referred to as a peripheral section since it is on the periphery of the pixel section 101. The peripheral circuit section 102 includes, for example, semiconductor elements such as a transistor, a diode, a capacitor, and the like. The pixel section 101 can include a plurality of unit pixels 108.

Each unit pixel can include at least one pixel (photoelectric converter). Hence, the pixel section 101 includes a plurality of pixels. The plurality of pixels can be arranged so as to form a plurality of rows and a plurality of columns. The peripheral circuit section 102 can include a vertical scanning circuit (row selection circuit) 103, a readout section 104, a horizontal scanning circuit (column selection circuit) 105, a timing controller 106, a plurality of column signal lines 107, and a signal processor 109. The vertical scanning circuit 103 selects a row of the pixel section 101. The readout section 104 reads out, via the plurality of corresponding column signal lines 107, signals of the respective pixels of a row selected by the vertical scanning circuit 103 from the pixel section 101. The readout section 104 includes, for example, a plurality of column circuits in which each circuit is arranged with respect to a corresponding column, and each column circuit can include, for example, an amplifier and an AD converter. The horizontal scanning circuit 105 selects the signals of one row (for example, a number of signals corresponding to the plurality of columns of the pixel section 101) that have been read out by the readout section 104 in accordance with the set order. The timing controller 106 controls the vertical scanning circuit 103, the readout section 104, and the horizontal scanning circuit 105. The signal processor 109 processes and outputs each signal which is read out from the readout section 104 and is selected by the horizontal scanning circuit 105.

Figure 2:
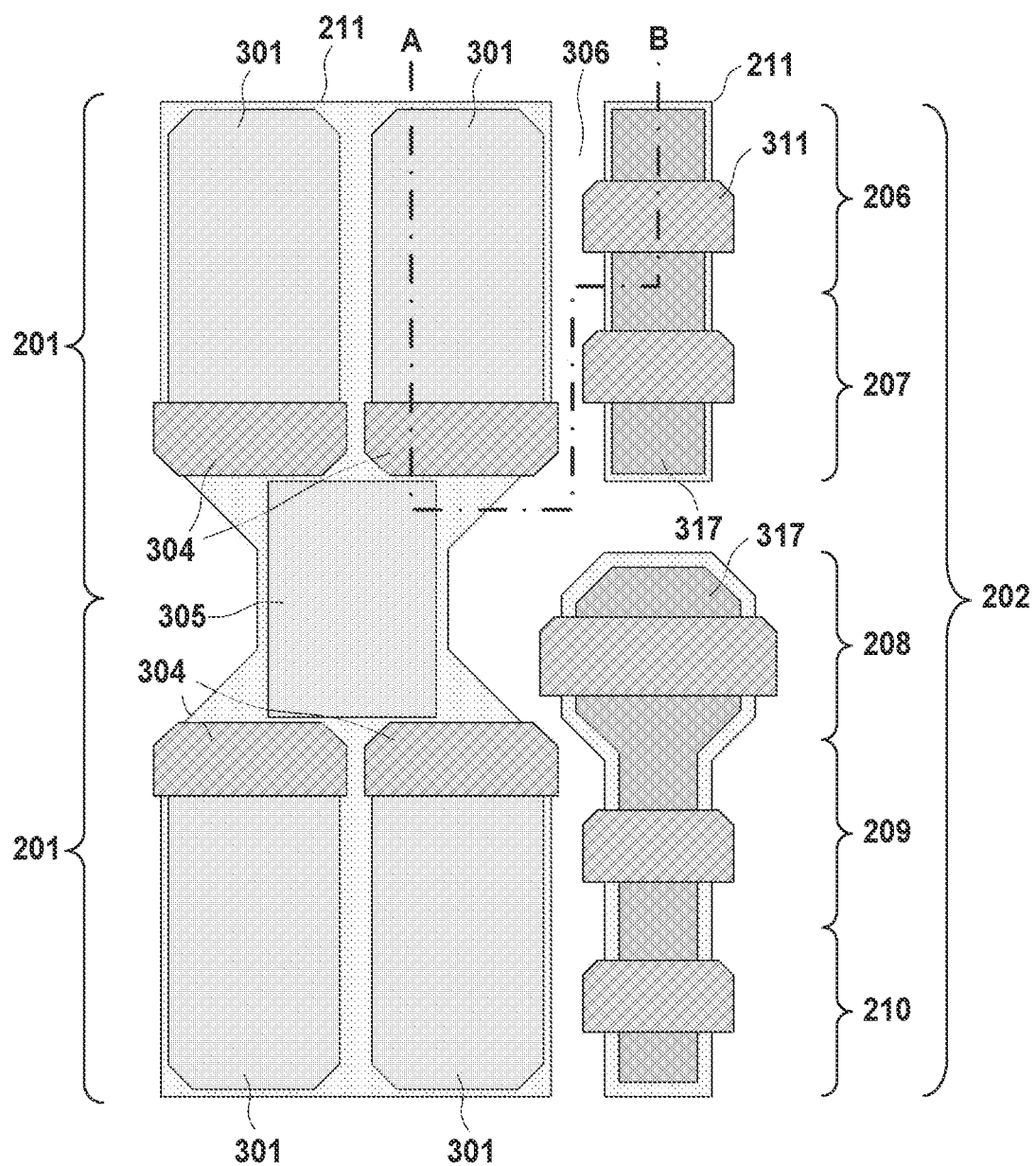
FIG. 2 is a plan view schematically showing a portion of a pixel section of the photoelectric conversion device according to the embodiment of the present invention.

FIG. 2 is a plan view schematically showing a partial arrangement of the pixel section 101 of the photoelectric conversion device 100. In FIG. 2, components such as a contact plug, a wiring layer, a color filter, a microlens, and the like have been omitted for the sake of descriptive convenience. The pixel section 101 can include first areas 201 and a second area 202. Each first area 201 can include charge accumulation regions 301, a floating diffusion region 305, and transfer electrodes 304 that form channels between the charge accumulation regions 301 and the floating diffusion region 305. Each unit pixel 108 of the pixel section 101 can include at least one pixel, and each pixel can include at least one photoelectric converter. Each photoelectric converter can include the charge accumulation region 301.

The first areas 201 and the second area 202 are arranged in active regions 211. An element separation region 306 is arranged between the active region 211 and the active region 211. Although one floating diffusion region 305 is arranged with respect to two first areas 201 in the example shown in FIG. 2, this is merely an example. For example, one floating diffusion region 305 can be arranged with respect to one first area 201. Alternatively, each first area 201 may be arranged in a corresponding one of the active regions 211 which are separated from each other, and one floating diffusion region 305 can be arranged with respect to each first area 201. In addition, although two charge accumulation regions 301 are arranged with respect to one first area 201 in the example of FIG. 2, a single charge accumulation region 301 may be arranged with respect to one first area 201.

In the second area 202, for example, a first selection transistor 206, a second selection transistor 207, an amplification transistor 208, a reset transistor 209, an additional capacitance transistor 210, and a well contact (not shown) can be arranged sequentially from the top in FIG. 2. Although one second area 202 is assigned with respect to two first areas 201 and one second area 202 is assigned with respect to four charge accumulation regions 301 (photoelectric converters) in the example of FIG. 2, this assignment is merely an example. For example, one second area 202 may be assigned with respect to one first area 201. In addition, the arrangement of the second area 202 is not limited to the example of FIG. 2, and for example, only the amplification transistor 208 may be arranged in the second area 202.

In the example of FIG. 2, the first selection transistor 206, the second selection transistor 207, the amplification transistor 208, the reset transistor 209, and the additional capacitance transistor 210 are arranged in the second area 202 of the active region 211. Also, in the example of FIG. 2, a first gettering region 317 is arranged in the second area 202 of the active regions 211. Although the first gettering region 317 is arranged with respect to the first selection transistor 206, the second selection transistor 207, the amplification transistor 208, the reset transistor 209, and the additional capacitance transistor 210 in the example shown in FIG. 2, this arrangement is merely an example. The first gettering region 317 can be arranged with respect to at least one of the first selection transistor 206, the second selection transistor 207, the amplification transistor 208, the reset transistor 209, and the additional capacitance transistor 210. For example, the first gettering region 317 may be arranged with respect to only the additional capacitance transistor 210 or may be arranged with respect to only the first selection transistor 206. Alternatively, the first gettering region 317 may be arranged with respect to only a contact region (not shown).

Figure 3:
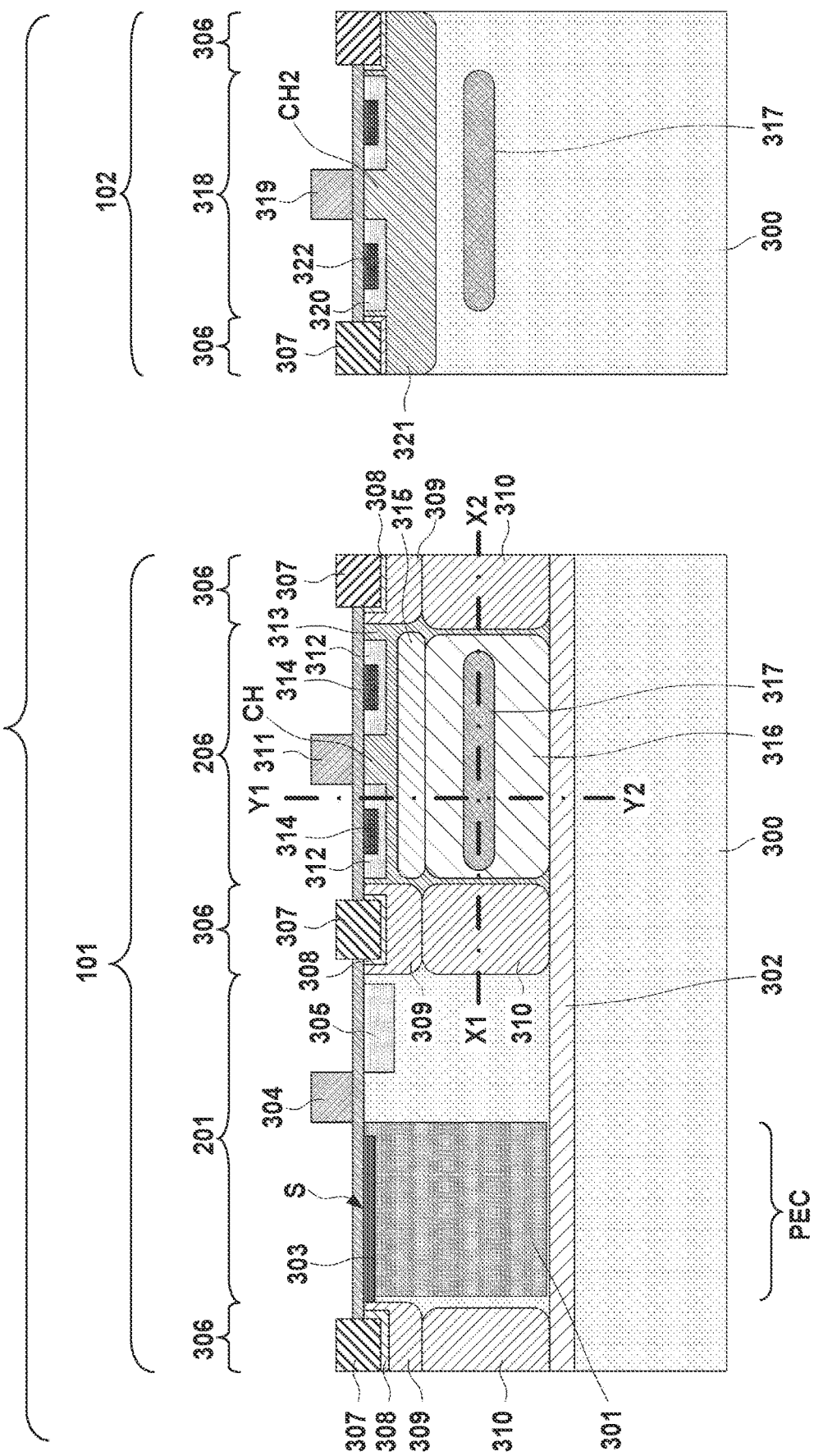
FIG. 3 is a sectional view of the photoelectric conversion device according to the embodiment of the present invention.

FIG. 3 shows a sectional view taken along a line A-B of the pixel section 101 shown in FIG. 2 and a partial sectional view of the peripheral circuit section 102. The photoelectric conversion device 100 includes a semiconductor substrate 300 made of silicon. Note that in this specification, a sectional view means a sectional view perpendicular to a surface S of the semiconductor substrate 300. In FIG. 3, components such as a contact, a wiring layer, a color filter, microlens, and the like have been omitted for the sake of descriptive convenience. Additionally, FIG. 3 shows the first area 201 and a part (the first selection transistor 206) of the second area. Although it will be assumed that the first conductivity type is the n-type and the second conductivity type is the p-type in the description of the following example, it may be set so that the first conductivity type is the p-type and the second conductivity type is the n-type. The surface S of the semiconductor substrate 300 is an interface between a semiconductor and an insulator or an interface between the semiconductor and a conductor. Each transistor is arranged on the surface S of the semiconductor substrate 300. More specifically, the surface S is the interface between a gate insulating film of the transistor and the semiconductor substrate 300, and the transistor includes a gate electrode on the surface S, source/drain regions below the surface S (inside the semiconductor substrate 300), and a channel region. This embodiment is also applicable to a back-side illumination photoelectric conversion device whose back surface on the side opposite to the surface S serves as a light receiving surface.

The pixel section 101 includes a photoelectric converter PEC arranged in the semiconductor substrate 300. The photoelectric converter PEC can include, for example, the charge accumulation region 301 that forms an n-type (first conductivity type) photoelectric conversion region (first region), a well 302 that forms a p-type (second conductivity type) photoelectric conversion region (second region), and a p-type (second conductivity type) surface region 303. A pnp photodiode can be formed by the n-type charge accumulation region 301, the p-type well 302, and the p-type surface region 303. The charge accumulation region 301 can accumulate charges serving as majority carriers among the negative charges (electrons) and the positive charges (holes) generated by light entering the photoelectric converter PEC (note that although the majority carriers are electrons in this example since the first conductivity type is the n-type, the majority carriers will be holes in a case in which the first conductivity type is the p-type). The well 302 can define the depth (bottom) of the charge accumulation region 301. The surface region 303 can be arranged so as to partially or entirely cover the charge accumulation region 301 for surface defect pinning of the semiconductor substrate 300.

The pixel section 101 can include the transfer electrode 304 arranged on the surface S of the semiconductor substrate 300 via a gate insulating film. The transfer electrode 304 forms a channel between the charge accumulation regions 301 and the floating diffusion region 305 (fourth region) when an active-level potential is provided. Charges accumulated in the charge accumulation region 301 are transferred to the floating diffusion region 305 through this channel. The potential of the floating diffusion region 305 is changed by the transfer of the charges from the charge accumulation region 301 through the channel. The amplification transistor 208 outputs, to the corresponding column signal line 107, a signal corresponding to the potential of the floating diffusion region 305, and this signal is read out by the readout section 104. In this manner, charges corresponding to light that entered the photoelectric converter PEC are accumulated in the charge accumulation region 301, and a signal corresponding to these charges is read out by the readout section 104 via the column signal line 107. The first selection transistor 206 and the second selection transistor 207 are made conductive when the photoelectric converter PEC that includes these transistors is selected. The reset transistor 209 becomes conductive when the potential of the floating diffusion region 305 is to be reset. The additional capacitance transistor 210 is connected to the floating diffusion region 305 via the reset transistor 209 and changes the capacitance of the floating diffusion region 305.

The pixel section 101 includes each element separation region 306 that separates the first area 201 and the second area 202 (the first selection transistor 206) which are adjacent to each other. Each element separation region 306 can include an STI (Shallow Trench Isolation) section which is a trench-shaped element separation section arranged on the surface S of the semiconductor substrate 300. The STI can include, for example, an insulator region 307 and an insulating film 308 formed along the inner wall of the trench. Each element separation region 306 can include a p-type channel stop region 309 arranged inside the semiconductor substrate 300 so as to surround the side surfaces and the lower surface of the STI and a p-type separation region 310 arranged below the corresponding p-type channel stop region 309 in the semiconductor substrate 300.

The first selection transistor 206 can include, for example, one gate electrode 311, two source/drain regions (third regions) 312, and a channel region CH arranged between the two source/drain regions 312. Each of the two source/drain regions 312 is a semiconductor region that can function as a source or a drain. One source/drain region 312 may be arranged so that it can be set to a state in which the region becomes the source or the drain in accordance with the supplied potential or may be arranged so that it will be constantly one of the source and the drain. The channel region CH is a portion of a first p-type well 313 arranged on the semiconductor substrate 300, and is positioned below the gate electrode 311. A channel is formed in the channel region CH so that the two source/drain regions 312 will be electrically connected by the application of an active-level potential on the gate electrode 311. The first selection transistor 206 can include two silicide regions 314 so as to be in contact with the two source/drain regions 312.

In the position below the first selection transistor 206, a second p-type well 315, a third p-type well 316, and the p-type fourth well 302 can be arranged in this order from the top. That is, the semiconductor substrate 300 can include, in the position below the first selection transistor 206, the second p-type well 315, the third p-type well 316, and the p-type fourth well 302 in this order from the top. The fourth well 302 is a well arranged at the deepest position. The fourth well 302 is arranged in common for the plurality of pixels (the plurality of photoelectric converters PEC) of the pixel section 101. Note that in this specification, a "well" means a semiconductor region. In addition, in this specification, a "position below" means a position below in a direction perpendicular to the surface S of the semiconductor substrate 300.

The semiconductor substrate 300 can include the first gettering region 317 in the third p-type well 316 (semiconductor region). The first gettering region 317 includes a gettering site. The first gettering region 317 can be arranged in a position that is below the n-type source/drain regions 312, which is an example of a first-conductivity-type region, and is apart from the source/drain regions 312. P-type semiconductor regions (the second p-type well 315 and the third p-type well 316 in this example), each of which is an example of a second-conductivity-type region, can be arranged between the first gettering region 317 and the n-type source/drain regions 312 which are examples of the first-conductivity-type region. The first gettering region 317 can be a region containing a group 14 element other than silicon. Since a group 14 element other than silicon is an impurity for the silicon forming the semiconductor substrate 300, the first gettering region 317 can be referred to as an impurity region. Here, the group 14 element other than silicon can be at least one of carbon and germanium. The density (concentration) of the group 14 element other than silicon in the first gettering region 317 can be, for example, equal to or more than $1 \times 10^{17}$ [atoms/cm$^3$]. The depth from the surface S, of the peak position in the density distribution (concentration distribution) of the group 14 element other than silicon in the first gettering region 317 falls within the range of 0.1 µm to 5 µm, and more preferably, falls within the range of 0.3 µm to 4 µm. The majority carrier density (p-type impurity density) of the third p-type well 316 (semiconductor region) can be equal to or more than $1 \times 10^{15}$ [atoms/cm$^3$].

In one example, the depth from the surface S, of the peak position in the density distribution of the group 14 element in the first gettering region 317 is smaller than that in the peak position of the density distribution of the majority carriers in the p-type well 302. Here, the depth from the surface S, of the peak position in the density distribution of the majority carriers of the p-type well 302 can match, for example, the depth from the surface S, of the peak position in the density distribution of a p-type impurity (for example, boron density) in the p-type well 302. In one example, the maximum density of a majority carrier (p-type impurity) of the second p-type well 315 is higher than the maximum density of the majority carrier (p-type impurity) of the third p-type well 316. According to such an arrangement, a potential barrier can be formed between the channel region CH of the first selection transistor 206 and the third p-type well 316 which includes the first gettering region 317.

The first selection transistor 206 can be arranged, in one section perpendicular to the surface S of the semiconductor substrate 300, so as to be sandwiched by the insulator regions 307 (STI) of the two element separation regions 306. In the section, the semiconductor substrate 300 includes two p-type separation regions 310 arranged below the insulator regions 307 (STIs) of the two element separation regions 306, and the first gettering region 317 can be arranged between the two separation regions 310. In one example, the maximum density of the majority carrier (p-type impurity) in the two p-type separation regions 310 is higher than the maximum density of the majority carrier (p-type impurity) in the third p-type well 316 (semiconductor region). According to such an arrangement, the separation regions 310 can form a potential barrier between the photoelectric converter PEC and the third p-type well 316 which includes the first gettering region 317.

The first gettering region 317 can be arranged for all or some of the plurality of transistors 206, 207, 208, 209, and 210 arranged in the second area 202. The first gettering region 317 may be arranged in only a position which is below at least a portion of the source/drain regions 312 (source and drain) of at least one transistor arranged in the second area. Alternatively, the first gettering region 317 may be formed in only a position below at least a portion of a contact region of each source/drain region 312. Here, the contact region is a region to which the contact plug of each source/drain region 312 is connected. The first gettering region 317 can include a portion arranged below the channel region CH.

A constant potential can be supplied to a well contact (not shown) that can be arranged in the second area 202. The potential can be provided to the p-type semiconductor regions (the well 302, the surface region 303, the p-type channel stop regions 309, the p-type separation regions 310, the first p-type well 313, the second p-type well 315, and the third p-type well 316) via the well contact.

The peripheral circuit section 102 can include a plurality of transistors (semiconductor elements). The plurality of transistors can include an n-type transistor (NMOS) and a p-type transistor (PMOS). The plurality of transistors can include a plurality of transistors which are supplied with different power supply voltages from each other. FIG. 3 shows one n-type transistor 318 as an example of the plurality of transistors of the peripheral circuit section 102. The transistor 318 can includes one gate electrode 319, two source/drain regions (semiconductor regions) 320, and a channel region CH2 arranged between the two source/drain regions 320. Each of the source/drain regions 320 is a region that can function as a source or a drain. The channel region CH2 is a portion of a p-type well 321 arranged on the semiconductor substrate 300. A channel is formed in the channel region CH2 by applying an active-level potential to the gate electrode 319 so as to electrically connect the two source/drain regions 320. The transistor 318 can include two silicide regions 322 so as to connect the two source/drain regions 320. An n-type semiconductor region of the semiconductor substrate 300 can be arranged below the p-type well 321. The semiconductor substrate 300 can include a second gettering region 323 within the n-type semiconductor region below (the source/drain regions 320 of) the transistor 318 in the peripheral circuit section 102. The second gettering region 323 can also be referred to as an impurity region. The second gettering region 323 includes a gettering site. The second gettering region 323 can be arranged in a position which is below the source/drain regions 320, as examples of a first conductivity type region, and is apart from the source/drain regions 320.

A p-type semiconductor region (the p-type well 321 in this example) as an example of the second-conductivity-type region can be arranged between the second gettering region 323 and the source/drain regions 320, each of which is an example of the first-conductivity-type region. The second gettering region 323 can be a region containing the group 14 element other than silicon. In one example, the depth from the surface S, of the peak position in the density distribution of the group 14 element in the second gettering region 323 is smaller than the depth of from the surface S of the peak position in the density distribution of a majority carrier in the well 302. The second gettering region 323 can be formed to have the same depth as the first gettering region 317, but may also be formed to have a depth different from that of the first gettering region 317.

The second gettering region 323 can be arranged in only a position which is below at least a portion of the source/drain regions 320 (source and drain) of at least one transistor arranged in the peripheral circuit section 102. Alternatively, the second gettering region 323 may be formed in only a position below at least a portion of a contact region of each source/drain region 320. Here, the contact region is a region to which the contact plug of each source/drain region 320 is connected. The second gettering region 323 can include a portion arranged below the channel region CH2. The type (metal type) of a metal forming the silicide regions 314 of the transistor 206 in each unit pixel 108 and the metal forming the silicide regions 322 of the transistor 318 in the peripheral circuit section 102 may be different or the same.

Two factors can be raised as the main factors that cause a metal impurity to enter the charge accumulation region 301. The first factor is the wafer process in the formation of the pixel section. More specifically, in an ion acceleration process such as ion implantation, dry etching, and the like for forming the pixel section 101, a metal impurity can enter the semiconductor substrate 300 or thermal diffusion of a silicide-formation metal forming each transistor of the pixel section to the semiconductor substrate 300 can occur. Contamination by a heavy metal such as tungsten, molybdenum, titanium, or the like is representative of metal contamination that accompanies the formation of the pixel section and greatly influences the white spot defect. Each of these heavy metals has a diffusion length of an extent in which the heavy metal can be diffused in the pixel section.

The second factor is thermal diffusion of a silicide-formation metal from the peripheral circuit portion to the photoelectric converter of each pixel. A silicide-formation metal that is used in a transistor of the peripheral circuit section 102 and greatly influences the white spot defect is a metal such as nickel, cobalt, or the like that has a long diffusion length. A metal such as nickel, cobalt, or the like has a larger diffusion coefficient in the semiconductor substrate than another metal atom, for example, a metal atom of the pixel section such as tungsten, titanium, or the like, and can easily spread to the photoelectric converter even in a low-temperature annealing process.

In order to cope with at least one of the above-described factors, the first gettering region 317 can be arranged in the transistor region of the pixel section 101 and/or the second gettering region 323 can be arranged in the transistor region of the peripheral circuit section 102. For the first factor, that is, the occurrence of metal contamination during the wafer process in the formation of the pixel section 101, it is effective to arrange the first gettering region 317 in a shallow position in the transistor region of the pixel section 101, in other words, in a position on the side of the photoelectric converter. As a result, heavy metals can be effectively gettered even in miniaturized low-temperature annealing process. On the other hand, a point of concern about arranging the first gettering region 317 on the side of the charge accumulation region 301 is that, since the gettering region itself is a high-density defect region, a defect or damage may erode the interface of the p-n junction of the photoelectric converter PEC and increase the dark current. In order to suppress such a side effect, it is preferable to arrange a potential barrier between the first gettering region 317 and the photoelectric converter PEC and a potential barrier between the first gettering region 317 and the channel region CH of the transistor region of the pixel section 101. As a result, the metal gettering effect can be increased without influencing pixel characteristics.

For the second factor, that is, the occurrence of thermal diffusion of a silicide-formation metal from the peripheral circuit section 102 to the photoelectric converter of the pixel section 101, it is effective to arrange the second gettering region 323 in a position below the transistor region of the peripheral circuit section 102. The second gettering region 323 can suppress the diffusion of the metal from the peripheral circuit section 102 to the pixel section 101.

FIG. 4A exemplifies the density of the group 14 element other than silicon in the first gettering region 317 and the density (majority carrier density) of the second-conductivity-type (p-type) impurity in a section taken along a line X1-X2 in FIG. 3. A broken line indicates the density of the group 14 element in the first gettering region 317, and a solid line indicates the density of the second-conductivity-type impurity. The abscissa indicates the position in a direction (horizontal direction) parallel to the surface S of the semiconductor substrate 300, and the ordinate indicates the density. The first gettering region 317 is formed by, for example, by generating a defect by implanting ions of an electrically inactive group 14 element to the semiconductor substrate 300.

In FIG. 4A, assume that x1 and x2 are peak positions of the density distribution of the second-conductivity-type impurity, and that $\Delta x1$ and $\Delta x2$ are the half widths of the respective peaks. Assume also that Gx is the peak position of the density distribution of the group 14 element other than silicon in the first gettering region 317, and that $\Delta Gx$ is the half width of the peak. A range $Gx \pm \frac{1}{2}*\Delta Gx$ of the half width $\Delta Gx$ of the peak of the density distribution of the group 14 element other than silicon in the first gettering region 317 can be positioned between two peaks $x1+\frac{1}{2}*\Delta x1$ and $x2-\frac{1}{2}*\Delta x2$ of the density distribution of the second-conductivity-type impurity. The second-conductivity-type impurity can form a potential barrier between the first gettering region 317 and the charge accumulation region 301. This can suppress the flow of charges caused by the level of the impurity gettered by the first gettering region 317, thereby effectively reducing the white spot defect and the dark current. The second-conductivity-type impurity also has the effect of suppressing the expansion of a depletion layer which is formed between the charge accumulation region 301 and the p-type separation region 310.

FIG. 4B exemplifies the density of the group 14 element other than silicon in the first gettering region 317 and the density (majority carrier density) of the second-conductive-type (p-type) impurity in a section taken along a line Y1-Y2 in FIG. 3. A broken line indicates the density of the group 14 element in the first gettering region 317, and a solid line indicates the density of the second-conductivity-type impurity. The abscissa indicates the depth from the surface S, of the semiconductor substrate 300, and the ordinate indicates the density. In FIG. 4B, assume that assume that y1 and y2 are peak positions of the density distribution of the second-conductivity-type impurity, and that $\Delta y1$ and $\Delta y2$ are the half widths of the respective peaks. Assume also that Gy is the peak position of the density distribution of the group 14 element other than silicon in the first gettering region 317, and that ΔGy is the half width of the peak. A range Gy±½*ΔGy of the half width ΔGy of the peak of the density distribution of the group 14 element other than silicon in the first gettering region 317 can be positioned between two peaks y1+½*Δy1 and y2−½*Δy2 of the density distribution of the second-conductivity-type impurity. The second-conductivity-type impurity can form a potential barrier between the first gettering region 317 and the transistor region of the pixel section 101. As a result, it is possible to suppress the transistor characteristics from changing due to the flow of carriers caused by the level of the impurity that is gettered by the first gettering region 317. In addition, the second-conductivity-type impurity has the effect of suppressing the expansion of a depletion layer that is formed between the well 315 and the source/drain regions 312 (the source and the drain) of the transistor region of the pixel section 101.

FIG. 4C shows the modification of FIG. 4B. In this example as well, the range Gy±½*ΔGy of the half width ΔGy of the peak of the density distribution of the group 14 element other than silicon in the first gettering region 317 is positioned between the two peaks y1+½*Δy1 and y2−½*Δy2 of the density distribution of the second-conductivity-type impurity. On the other hand, the impurity density of the peak position y2 on the deep side is lower than that of the peak position y1. This kind of arrangement is effective in releasing the carriers to the side of the semiconductor substrate 300 in one hand while, on the other hand, suppressing carrier diffusion and maintaining a potential barrier against the transistor side of the pixel section 101. The density distributions shown in FIGS. 4A, 4B, and 4C are merely examples and do not limit the present invention.

Figure 5:
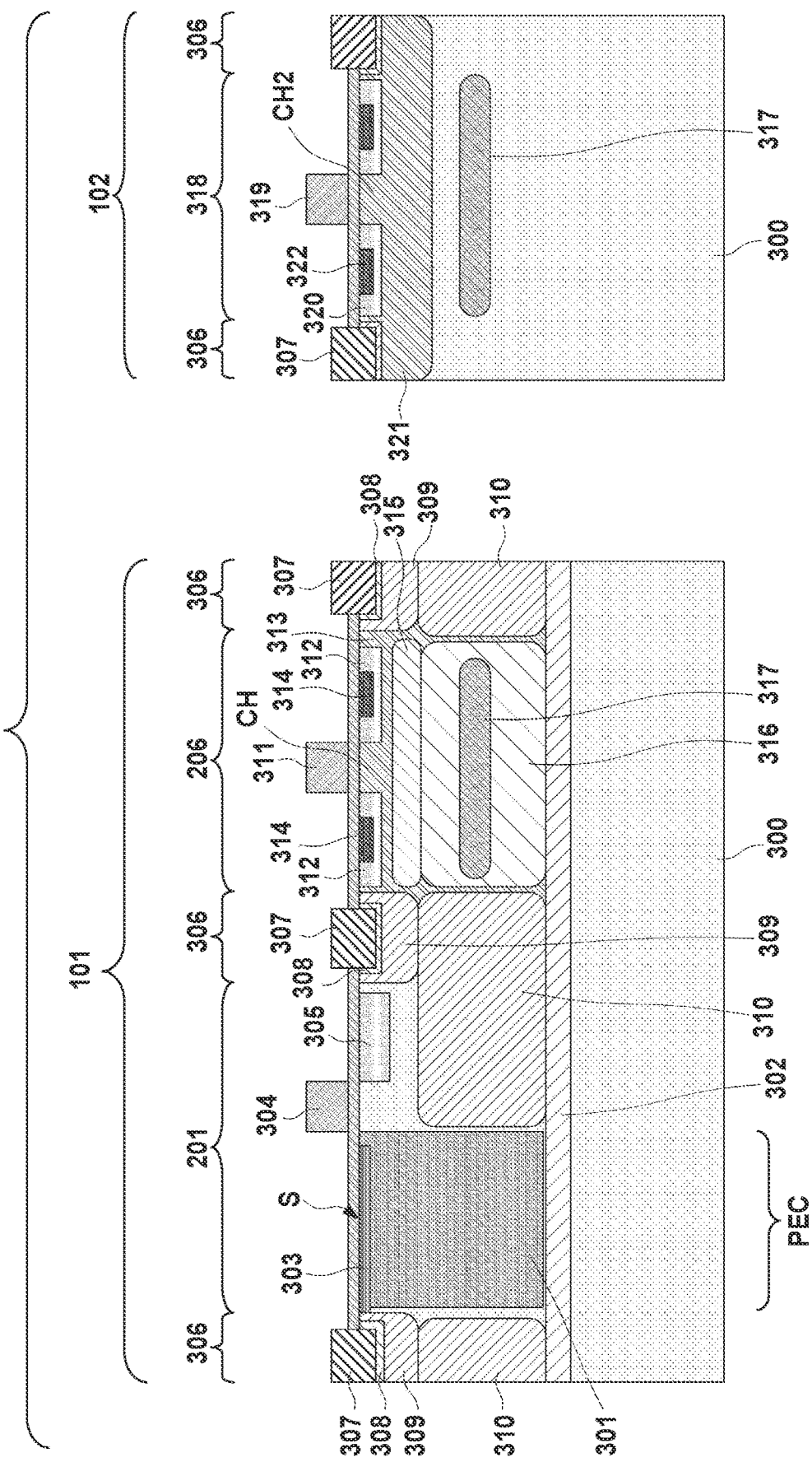
FIG. 5 is a view showing the first modification.

FIG. 5 shows the first modification of the embodiment shown in FIG. 3. In the first modification, the width (width in a direction parallel to the surface S of the semiconductor substrate 300) of the p-type separation region 310 between the photoelectric converter PEC and the first gettering region 317 has been expanded. The p-type separation region 310 can be expanded, for example, so as to include a portion which is to be arranged below the floating diffusion region 305. Alternatively, the p-type separation region 310 can be expanded so as to include a portion which is to be arranged below the channel region below the transfer electrode 304. This kind of arrangement is effective in suppressing, more reliably, the generation of a dark current caused by the first gettering region 317.

Figure 6:
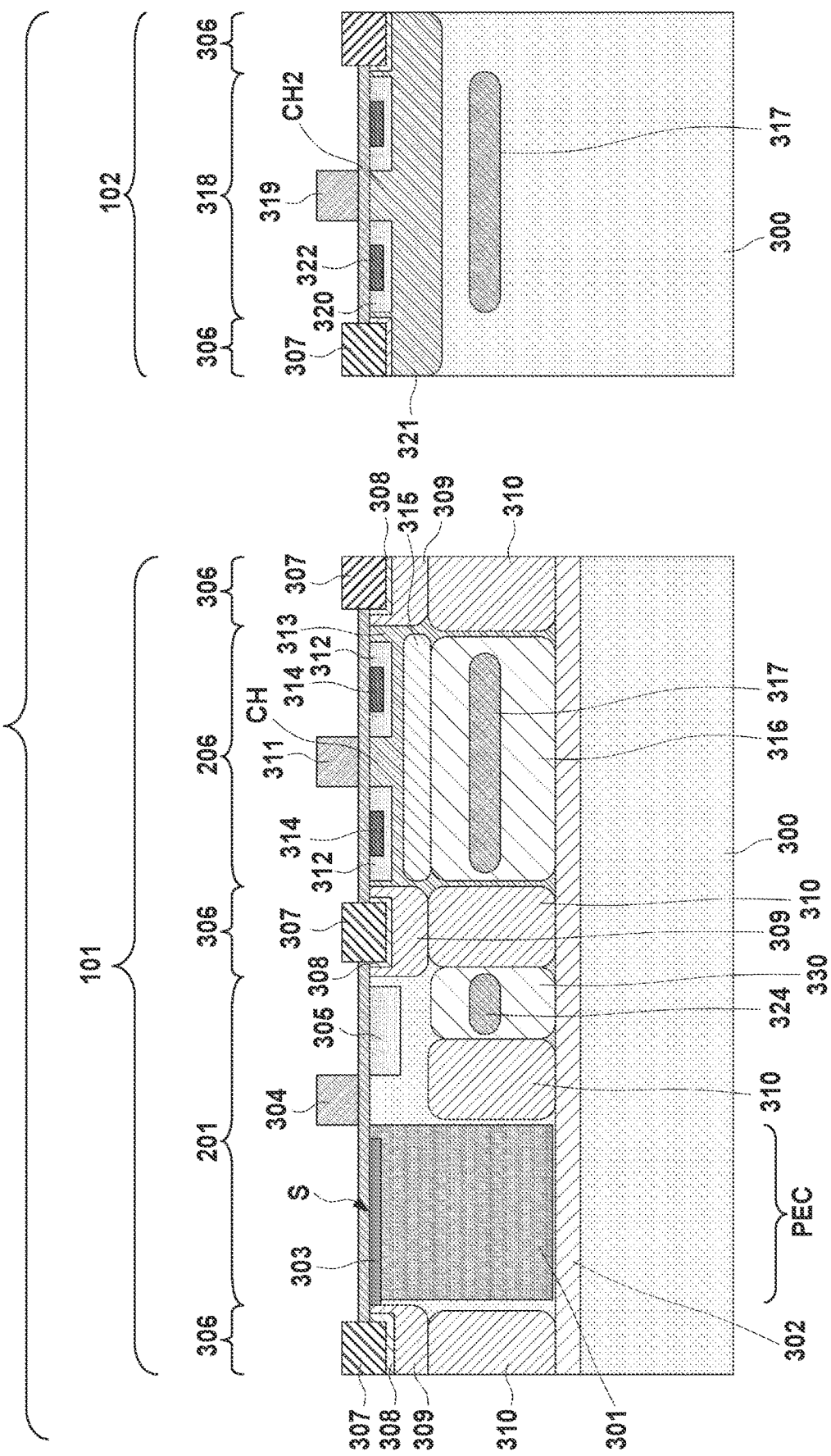
FIG. 6 is a view showing the second modification.

FIG. 6 shows the second modification of the embodiment shown in FIG. 3. In the second modification, an additional gettering region 324 is arranged below at least one portion of the floating diffusion region 305. The gettering region 324 can be arranged in a p-type semiconductor region 330 arranged below the floating diffusion region 305. The p-type separation region 310 can be arranged between the p-type semiconductor region 330 and the photoelectric converter PEC. The maximum density of a majority carrier (p-type impurity) in the p-type separation region 310 can be higher than the maximum density of a majority carrier (p-type impurity) in the p-type semiconductor region 330. According to this kind of arrangement, the p-type separation region 310 can form a potential barrier between the photoelectric converter PEC and the p-type semiconductor region 330 including the gettering region 324.

Figure 7:
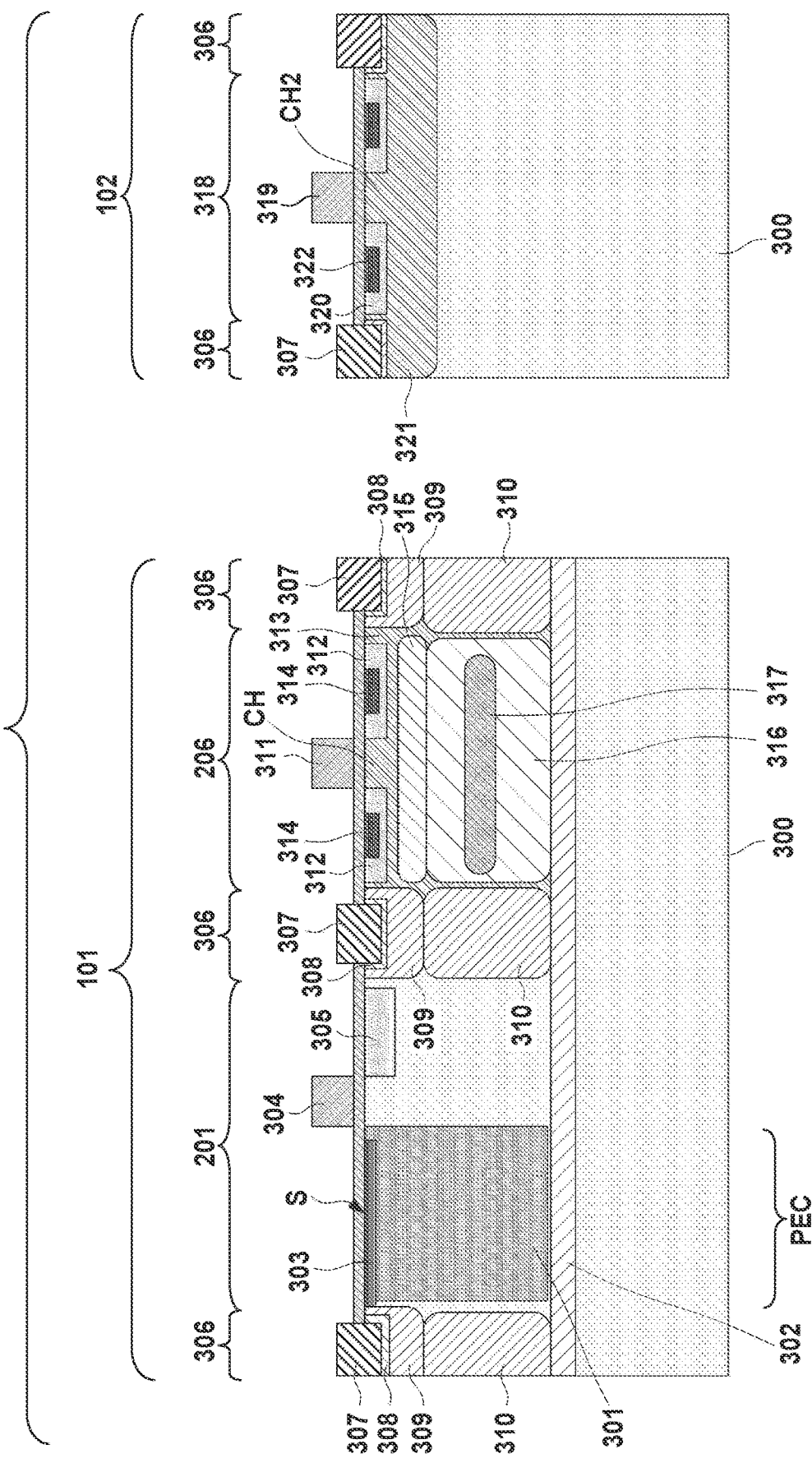
FIG. 7 is a view showing the third modification.

FIG. 7 shows the third modification of the embodiment shown in FIG. 3. The third modification includes an arrangement in which the second gettering region 323 has been removed from the embodiment shown in FIG. 3. The third modification is effective for a case in which contamination of the photoelectric converter PEC by a metal for forming the silicide regions 322 to be arranged in the peripheral circuit section 102 can be tolerated, and for a case in which the silicide regions 322 are not to be arranged in the peripheral circuit section 102.

Figure 8:
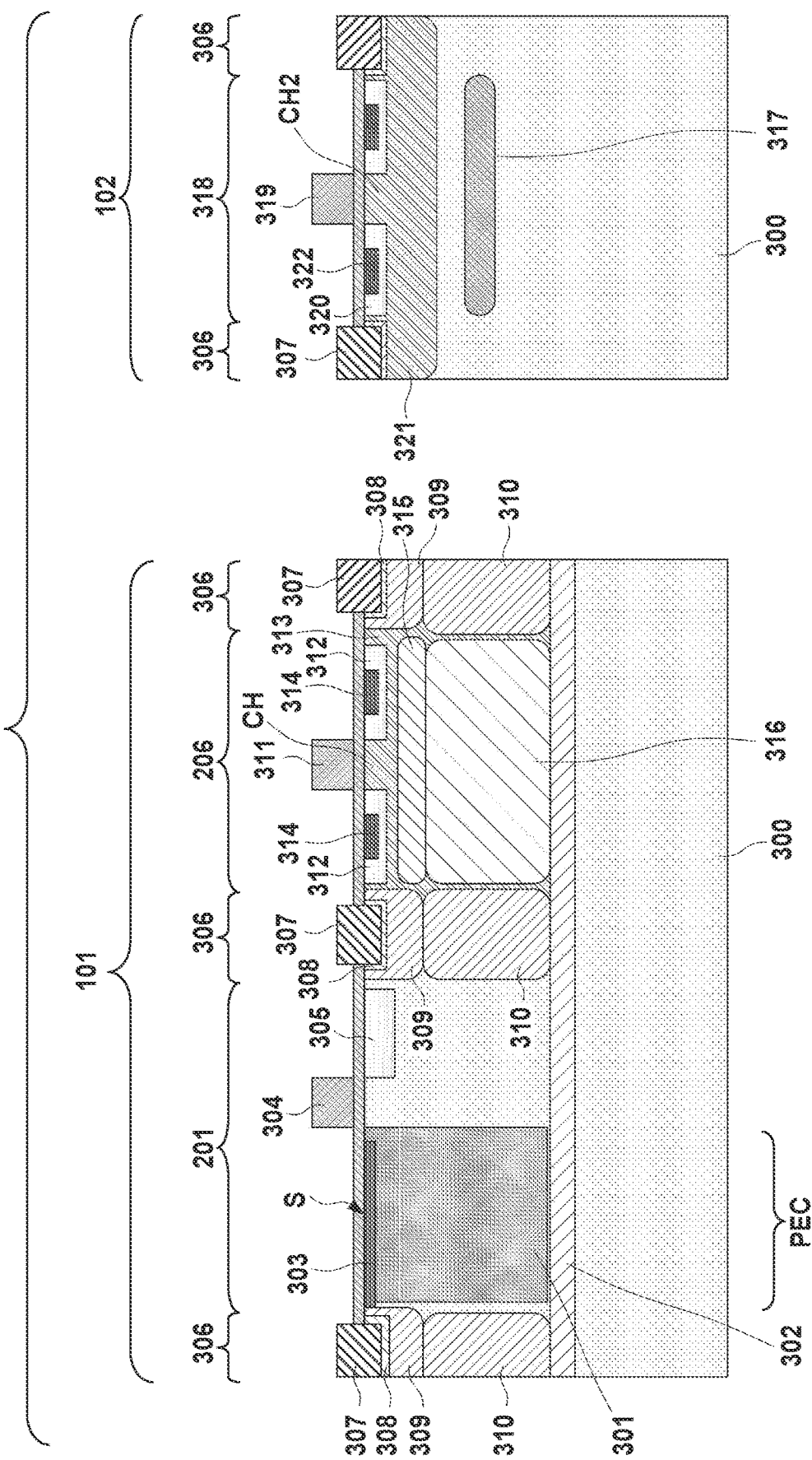
FIG. 8 is a view showing the fourth modification.

FIG. 8 shows the fourth modification of the embodiment shown in FIG. 3. The fourth modification has an arrangement in which the first gettering region 317 has been removed from the embodiment shown in FIG. 3. The fourth modification is effective for a case in which the above-described first factor, that is, metal contamination during the wafer process in the formation of the pixel section can be tolerated.

Figure 9:
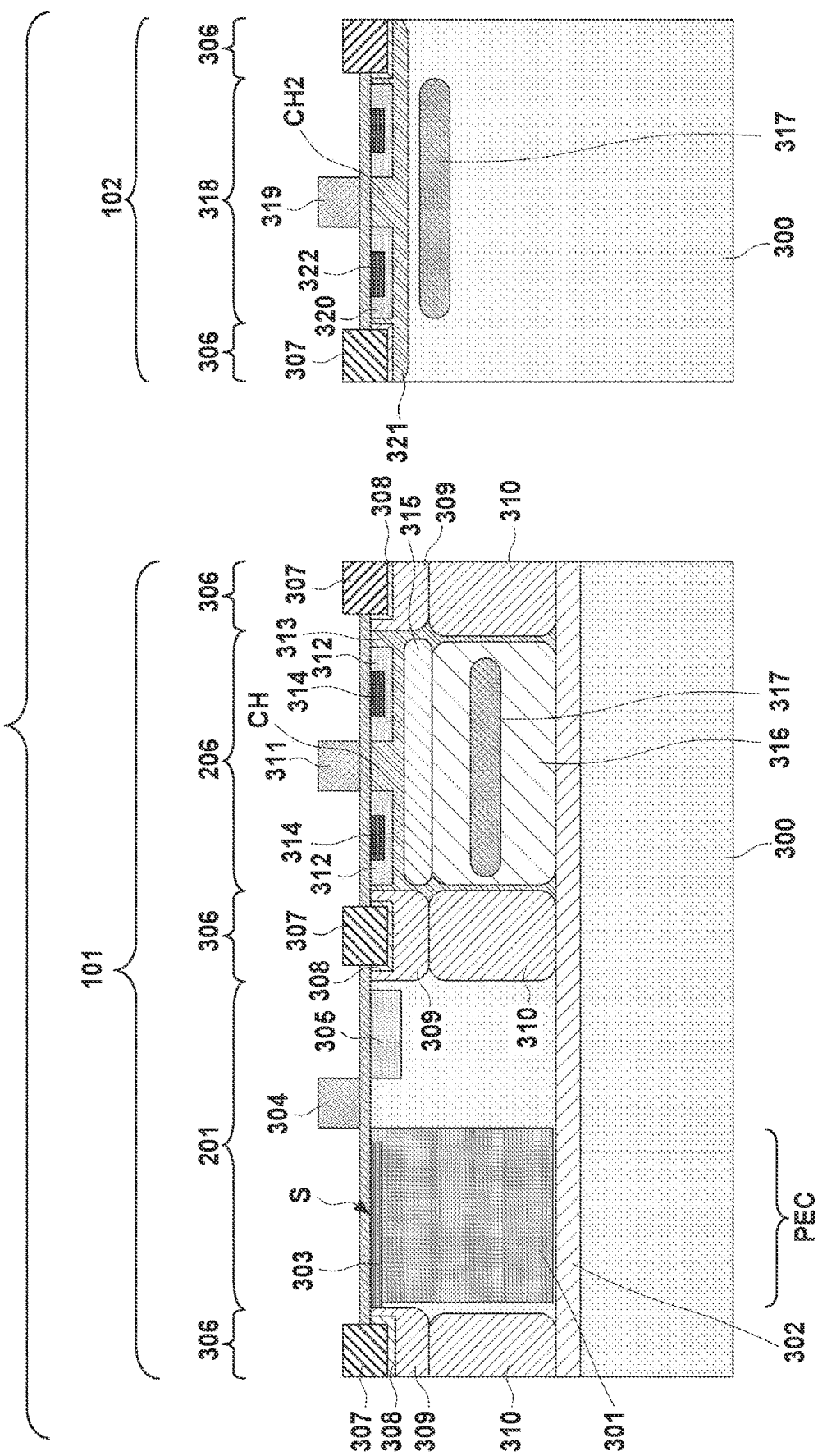
FIG. 9 is a view showing the fifth modification.

FIG. 9 shows the fifth modification of the embodiment shown in FIG. 3. In the fifth modification, the second gettering region 323 is arranged in a position (position close to the surface S of the semiconductor substrate 300) which is shallower than the first gettering region 317. This kind of arrangement is for gettering a heavy metal in a position closer to the contamination source in the peripheral circuit section 102. In contrast to the arrangement shown in FIG. 9, the second gettering region 323 may also be arranged in a position (a position far from the surface S of the semiconductor substrate 300) deeper than the first gettering region 317.

Figure 10:
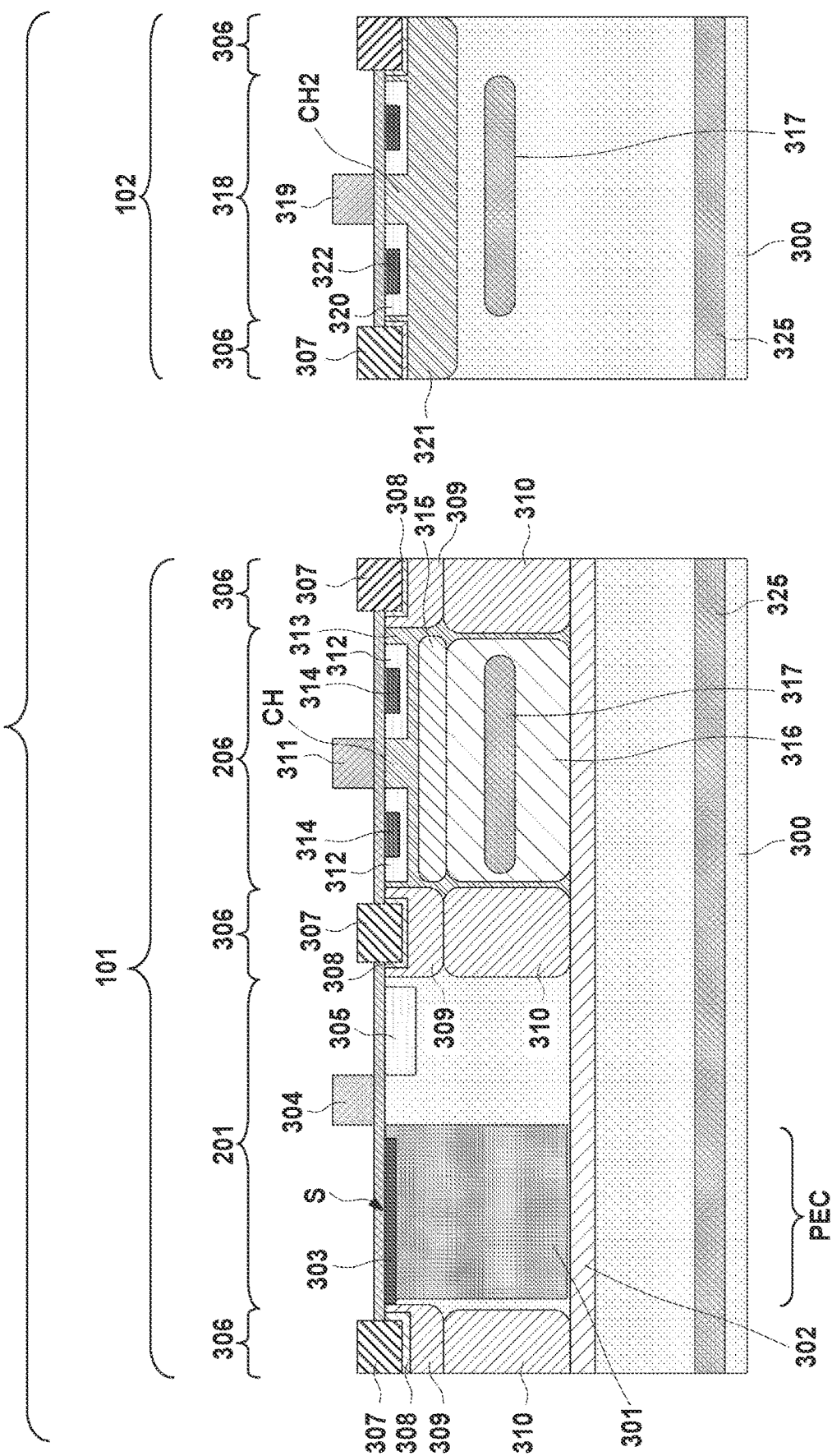
FIG. 10 is a view showing the sixth modification.

FIG. 10 shows the sixth modification of the embodiment shown in FIG. 3. In the sixth modification, a third gettering region 325 has been arranged in a position deeper than the first gettering region 317 of the pixel section 101 and the second gettering region 323 of the peripheral circuit section 102. The third gettering region 325 can be referred to as an impurity region. The third gettering region 325 can be arranged in one or both of the pixel section 101 and the peripheral circuit section 102. The third gettering region 325 can be arranged in a position deeper than the lower end of the fourth p-type well 302, for example, a position deeper by 1 to 5 μm from the lower end of the fourth p-type well 302. In one example, the density of the group 14 element other than silicon in the third gettering region 325 is higher than those in the first gettering region 317 and the second gettering region 323. The sixth modification can be implemented by using the semiconductor substrate 300 in which a gettering region has been formed by a cluster ion made of a carbon complex or carbon below the epitaxial region for device formation.

The sixth modification is effective for a case in which the semiconductor substrate 300 itself contains a metal impurity and there is concern that the metal impurity will diffuse from inside the semiconductor substrate 300 to the device formation region. The third gettering region 325 of the sixth modification can also contribute to gettering a metal impurity that has mixed into the device formation region. In the same manner, the same effect can be expected by forming a back-side gettering site by polysilicon or the like on the back side of the semiconductor substrate 300. These arrangements can be combined without departing from the scope of the present invention.

Figure 11:
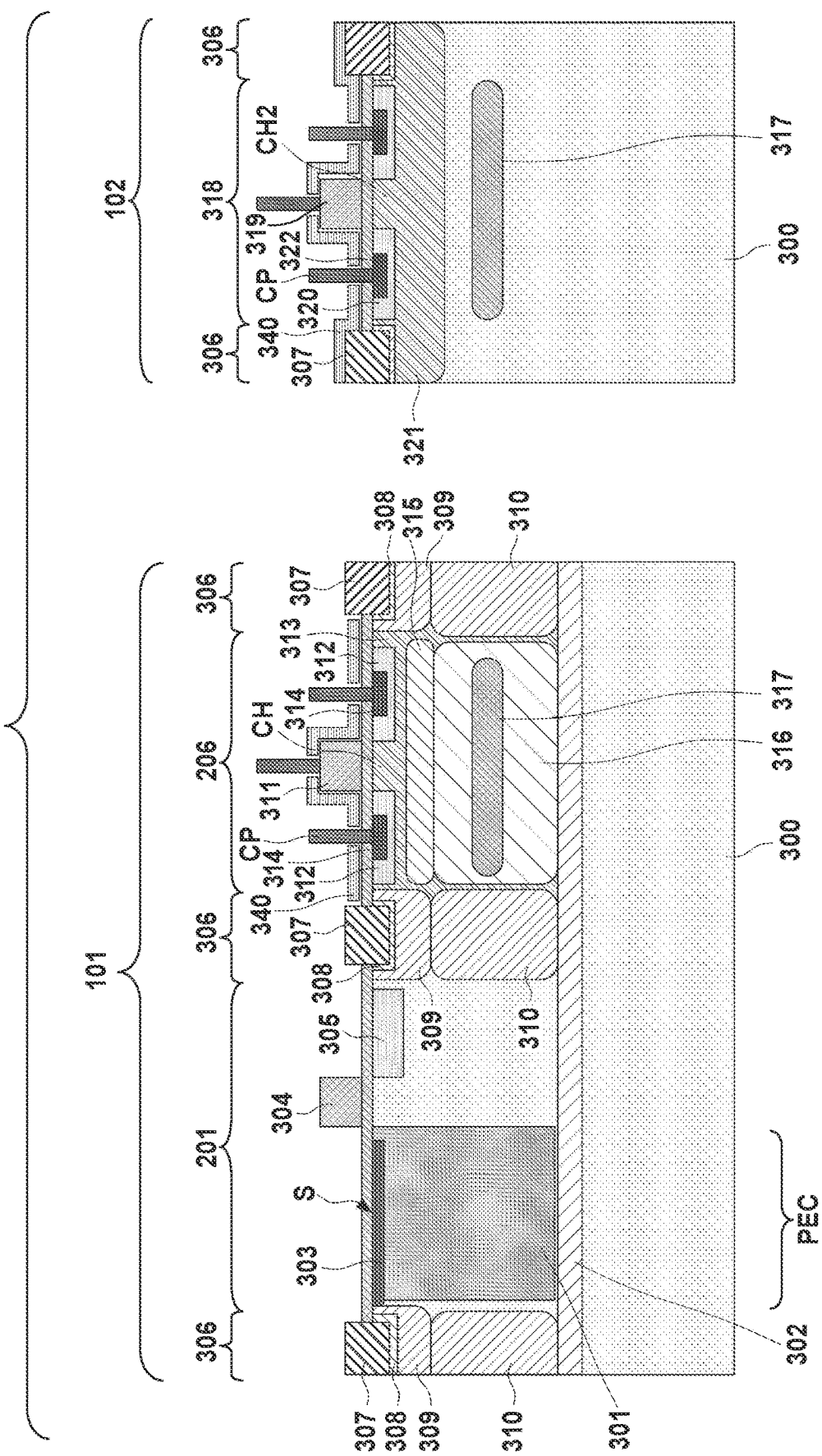
FIG. 11 is a view showing the seventh modification.

FIG. 11 shows the seventh modification of the embodiment shown in FIG. 3. In the seventh modification, a light shielding layer 340 is arranged above the first gettering region 317 of the pixel section 101 and/or above the second gettering region 323 of the peripheral circuit section 102. The light shielding layer 340 has an opening to pass a contact plug CP, and the light shielding layer 340 and the contact plug CP can be insulated by an insulating film (not shown). When light enters the first gettering region 317, optical carriers or the like are, for example, accumulated in the third p-type well 316 via a defect level or the like, and the carriers can flow into the charge accumulation region 301 or the like. In the same manner, light entering the second gettering region 323 can influence the operation of the transistor of the peripheral circuit section 102. Hence, the light shielding layer 340 as that described above can be arranged.

The method of manufacturing the photoelectric conversion device 100 will be exemplified below with reference to FIGS. 12, 13, and 14. First, in step S110, element separation regions 306 are formed on the pixel section 101 and the peripheral circuit section 102. More specifically, trenches are formed by forming a mask that has openings in regions where the element separation regions 306 are to be formed and etching the semiconductor substrate 300 via the openings. The mask can be formed by, for example, a polysilicon film and a silicon nitride film. The depth of each trench can be, for example, about 150 to 300 nm. In addition, the insulating film 308 is formed along the interior surface of each trench so as to cover the bottom surface and the side surfaces of the trench. For example, each insulating film 308 can be formed by thermally oxidizing the corresponding trench in an oxidizing gas atmosphere.

Next, for each p-type channel stop region 309, for example, boron is ion-implanted to the semiconductor substrate 300 through each opening of the mask to form the p-type channel stop region 309. Next, an insulating film for forming the insulator region 307, which has filled each trench so as to cover the insulating film 308, is formed. The insulating film is, for example, a silicon nitride film formed by a high-density plasma CVD method. Next, each insulator region 307 is formed by planarizing the insulating film by a combination of etching and CMP. Next, a thermal oxidation film is formed on the surface of the semiconductor substrate 300. This thermal oxidation film is arranged for the purpose of suppressing channeling during ion implantation.

Next, in step S112, the fourth p-type well 302 and the p-type separation regions 310 of the pixel section 101 are formed. First, the fourth p-type well 302 is formed by implanting a p-type impurity with high energy in the pixel section 101 in a state in which the peripheral circuit section 102 is covered by a resist. Next, a mask with openings in regions where the p-type separation regions 310 are to be formed is formed, and each p-type separation region 310 is formed by implanting a p-type impurity to the semiconductor substrate 300 via the corresponding opening. By performing the process of step S112 of executing high-acceleration ion implantation before the processes of subsequent steps, the formation of an amorphous layer on the surface of the device can be suppressed, and the controllability of the ion implantation can be increased.

In step S114, the charge accumulation region 301 and the third p-type well 316 of the pixel section 101 are formed. Here, the charge accumulation region 301 can be formed by forming a mask with an opening in a region where the charge accumulation region 301 is to be formed, and implanting an n-type impurity in the semiconductor substrate 300 via the opening. The third p-type well 316 can be formed by forming a mask with an opening in a region where the third p-type well 316 is to be formed, and implanting a p-type impurity in the semiconductor substrate 300 via the opening.

Next, in step S116, the first gettering region 317 is formed in the pixel section 101, and the second gettering region 323 is formed in the peripheral circuit section 102. The first gettering region 317 and the second gettering region 323 may be formed simultaneously or separately. In one example, the first gettering region 317 and the second gettering region 323 are formed by forming a mask 310 which has openings and implanting the group 14 element other than silicon in the semiconductor substrate 300 through the openings. Here, the opening for forming the first gettering region 317 can be formed to fall within the third p-type well 316 in an orthographic projection (alternatively in a planar view) with respect to the surface S of the semiconductor substrate 300. The opening for forming the second gettering region 323 can be formed to fall within a region surrounded by the element separation regions 306 in an orthographic projection (alternatively in a planar view) with respect to the surface S of the semiconductor substrate 300. The mask 310 may be formed from a photoresist or a hard mask such as an oxide film or a nitride film.

After the mask 310 is formed, the group 14 element other than silicon is implanted to the semiconductor substrate 300 through each opening of the mask 310. In one example, the first gettering region 317 and the second gettering region 323 are formed by ion-implanting carbon in an acceleration energy range of 200 to 3,000 keV and in a dose range of 1e12 to $1 \times 10^{16}$ atoms/cm$^2$. For each of the first gettering region 317 and the second gettering region 323, the gettering site may be may be formed by performing the ion implantation once or may be formed by performing the ion implantation a plurality of times by using different acceleration energies and/or different dosages from each other. Also, ion implantation may be performed by changing the temperature of the semiconductor substrate 300 to fall within the range of −100° C. to +400° C. to improve the gettering effect.

Next, in step S118, the second p-type well 315 and the first p-type well 313 of the pixel section 101, and the fourth p-type well 321 of the peripheral circuit section 102 are formed. These wells can be formed by forming a photoresist pattern mask that has openings and implanting ions to the semiconductor substrate 300 through the openings. Note that, although not shown, a process for forming another well and a process for forming a channel region can also be performed. By thermally oxidizing the semiconductor substrate 300 after releasing the thermal oxidation film (sacrificial oxide film) on the surface of the semiconductor substrate 300, a gate insulating film for the transistor of each of the pixel section 101 and the peripheral circuit section 102 is formed. Here, in a case in which a plurality of transistors with different driving voltages from each other and the like are to be formed, gate insulating films that have different film thicknesses from each other can be formed.

In this thermal oxidation process, the metal impurity in the pixel section 101 and that in the peripheral circuit section 102 are gettered by the first gettering region 317 and the second gettering region 323, respectively.

Next, in step S120, activation annealing of the gate electrode, the source, the drain, LDD, and HALO of the transistor of the pixel section 101, those of the peripheral circuit section 102, the p-type surface region 303 of the charge accumulation region 301, and an implanted dopant are sequentially performed.

Although it is not shown in the drawings, an anti-reflection structure on the photoelectric converter PEC and side walls of each transistor of the pixel section 101 and those of the peripheral circuit section 102 can be formed. Next, a metal silicide region of the transistor of the peripheral circuit section 102 can be formed. Next, the metal silicide regions and the contact plugs of the pixel section 101 are formed, and a multilayer wiring layer and the like can be formed. When forming the metal silicide regions in the pixel section 101 and the peripheral circuit section 102 described above and in the processes of forming an interlayer film for wiring and performing alloy annealing on the wiring, the metal atoms for the silicide region can diffuse. However, the first gettering region 317 and the second gettering region 323 can getter the metal atoms.

As described above, the problem of the white spot defect and the dark current due to metal contamination accompanying the wafer process for forming the pixel section and metal contamination accompanying the wafer process of the forming the peripheral circuit section can be reduced by the formation of the first, second, and third gettering regions. The first gettering region 317 and the second gettering region 323 need not be formed by the above-described method, and various changes can be made. For example, a gettering site may be formed in only a position immediately below the source and the drain by performing ion implantation via a mask for the formation of the gate electrode in the process of forming the gate electrode of each transistor. Alternatively, ion implantation for gettering region formation may be executed immediately before the ion implantation for the source and the drain in the process for forming the source and the drain of the transistor. In this case, a gettering region can be formed below the gate electrode by implanting ions to the semiconductor substrate through the polysilicon of the gate electrode. The gettering region may also be formed by implanting ions in only a position immediately below the contact plug before forming the contact plug and the metal silicide regions of the pixel section 101 and the peripheral circuit section 102.

As application examples of the photoelectric conversion device 100 according to the above-described embodiment, an electronic equipment such as a camera or a smartphone incorporating the photoelectric conversion device 100 as an image sensing device and a transportation equipment such as an automobile will be exemplified hereinafter. Here, the concept of a camera includes not only a device whose main purpose is image sensing but also a device (for example, a personal computer, a mobile terminal such as a tablet, etc.) that auxiliarly has an image sensing function.

Figure 15:
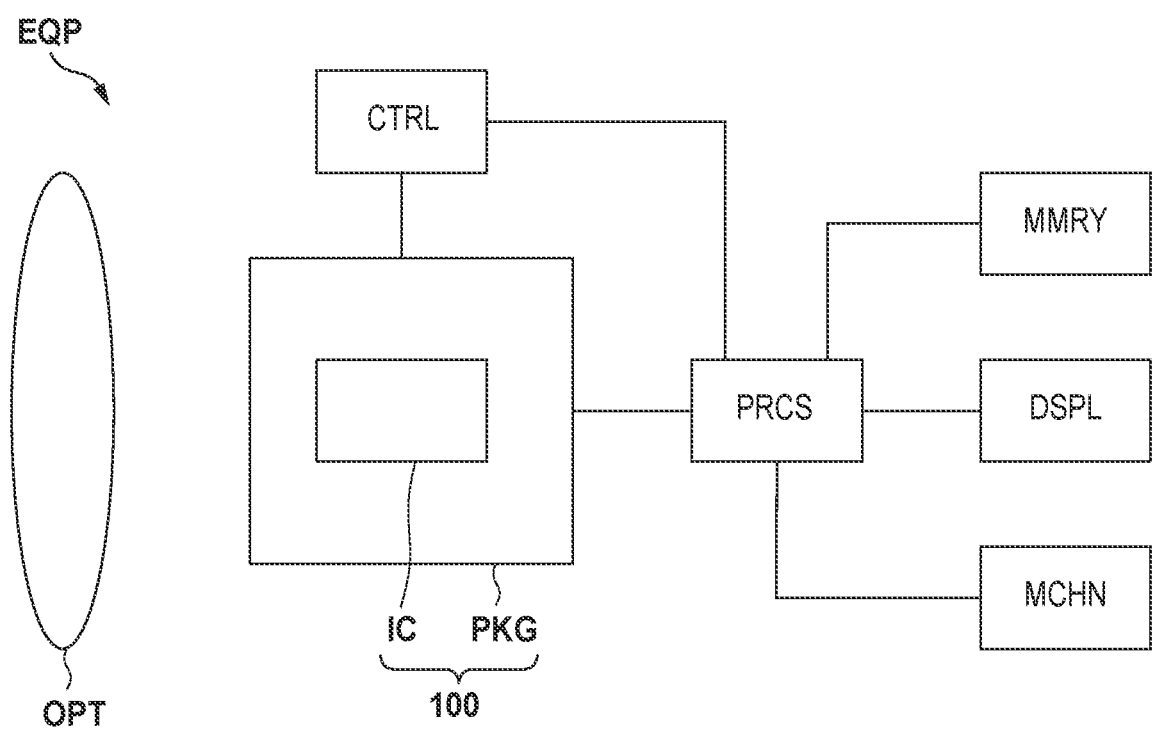
FIG. 15 is a view showing the arrangement of an equipment according to the embodiment of the present invention.

FIG. 15 is a schematic view of an equipment EQP incorporating the photoelectric conversion device 100. An electronic equipment (an information equipment) such as a camera or a smartphone, a transportation equipment such as an automobile or an airplane, or the like is an example of the equipment EQP. The photoelectric conversion device 100 can include, other than a semiconductor device IC that includes a semiconductor substrate (semiconductor chip) on which the pixel section 101 and the peripheral circuit section 102 have been arranged, a package PKG that contains the semiconductor device IC. The package PKG can include a base on which the semiconductor device IC is fixed and a lid member made of glass or the like which faces the semiconductor device IC, and connection members such as a bump and a bonding wire that connect a terminal arranged in the base to a terminal arranged in the semiconductor device IC. The equipment EQP can further include at least one of an optical system OPT, a control device CTRL, a processing device PRCS, a display device DSPL, and a memory device MMRY. The optical system OPT forms an optical image on the photoelectric conversion device 100 and is formed from, for example, a lens, a shutter, and a mirror. The control device CTRL controls the operation of the photoelectric conversion device 100 and is a semiconductor device such as an ASIC. The processing device PRCS processes signals output from the photoelectric conversion device 100 and is a semiconductor device such as a CPU or an ASIC for forming an AFE (Analog Front End) or a DFE (Digital Front End). The display device DSPL is an EL display device or a liquid crystal display device that displays information (image) acquired by the photoelectric conversion device 100. The memory device MMRY is a magnetic device or a semiconductor device for storing information (image) acquired by the photoelectric conversion device 100. The memory device MMRY is a volatile memory such as an SRAM, DRAM, or the like or a nonvolatile memory such as a flash memory, a hard disk drive, or the like. A mechanical device MCHN includes a driving unit or propulsion unit such as a motor, an engine, or the like. The mechanical device MCHN in the camera can drive the components of the optical system OPT for zooming, focusing, and shutter operations. In the equipment EQP, signals output from the photoelectric conversion device 100 are displayed on the display device DSPL and are transmitted externally by a communication device (not shown) included in the equipment EQP. Hence, the equipment EQP may further include the memory device MMRY and the processing device PRCS that are separate from a storage circuit unit and a calculation circuit unit included in a control/signal processing circuit provided in the photoelectric conversion device 100.

Figure 16A:
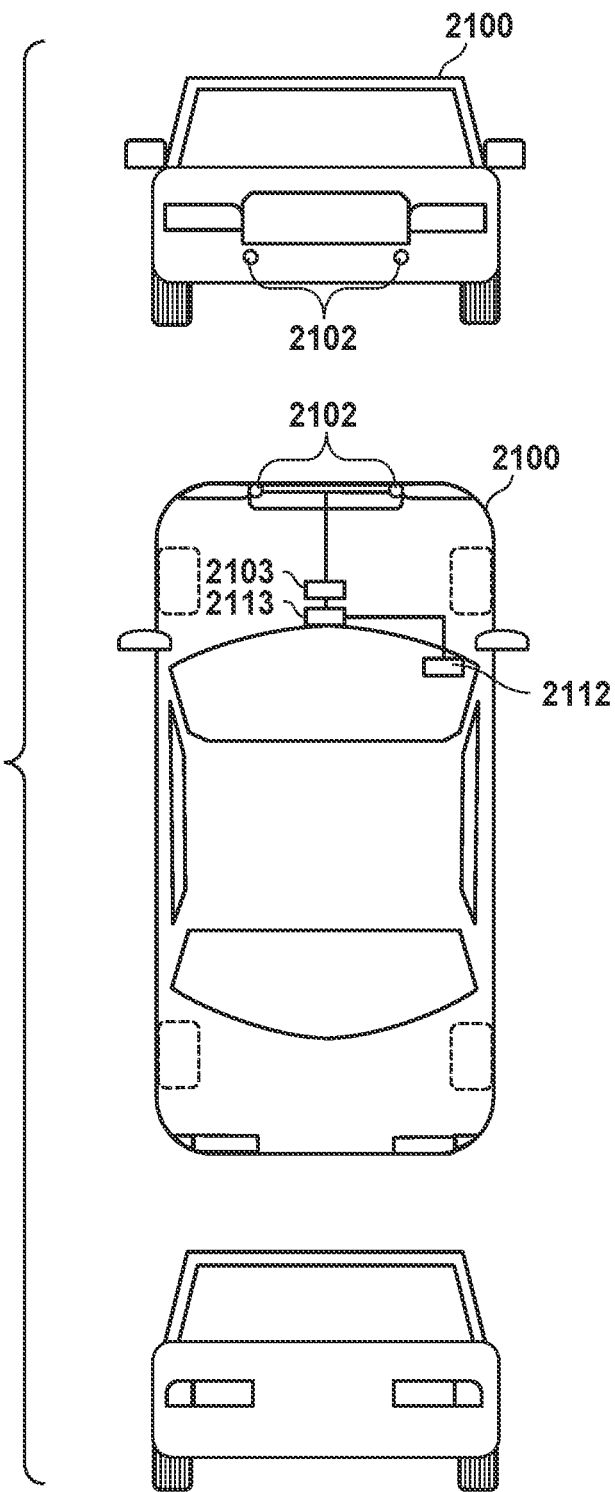

As described above, the photoelectric conversion device 100 according to the embodiments can obtain an image in which the generation of blooming has been suppressed or an image with a wide dynamic range. Hence, a camera incorporating the photoelectric conversion device 100 is applicable as a monitoring camera, an onboard camera mounted in a transportation equipment such as an automobile or a railroad car, or the like. A case in which the camera incorporating the photoelectric conversion device 100 is applied to a transportation equipment will be exemplified here. A transportation equipment 2100 is, for example, an automobile including an onboard camera 2101 shown in FIGS. 16A and 16B. FIG. 16A schematically shows the outer appearance and the main internal structure of the transportation equipment 2100. The transportation equipment 2100 includes photoelectric conversion devices 2102, an image sensing system ASIC (Application Specific Integrated Circuit) 2103, a warning device 2112, and a control device 2113.

The above-described photoelectric conversion device 100 is used in each photoelectric conversion device 2102. The warning device 2112 warns a driver when it receives an abnormality signal from an image-sensing system, a vehicle sensor, a control unit, or the like. The control device 2113 comprehensively controls the operations of the image sensing system, the vehicle sensor, the control unit, and the like. Note that the transportation equipment 2100 need not include the control device 2113. In this case, the image sensing system, the vehicle sensor, and the control unit each can individually include a communication interface and exchange control signals via a communication network (for example, CAN standards).

FIG. 16B is a block diagram showing the system arrangement of the transportation equipment 2100. The transportation equipment 2100 includes the first photoelectric conversion device 2102 and the second photoelectric conversion device 2102. That is, the onboard camera according to this embodiment is a stereo camera. An object image is formed by an optical section 2114 on each photoelectric conversion device 2102. An image signal output from each photoelectric conversion device 2102 is processed by an image pre-processor 2115 and transmitted to the image sensing system ASIC 2103. The image pre-processor 2115 performs processing such as S-N calculation and synchronization signal addition. The above-described signal processor 109 corresponds to at least a part of the image pre-processor 2115 and the image sensing system ASIC 2103.

The image sensing system ASIC 2103 includes an image processor 2104, a memory 2105, an optical distance measuring unit 2106, a parallax calculator 2107, an object recognition unit 2108, an abnormality detection unit 2109, and an external interface (I/F) unit 2116. The image processor 2104 generates an image signal by processing signals output from the pixels of each photoelectric conversion device 2102. The image processor 2104 also performs correction of image signals and interpolation of abnormal pixels. The memory 2105 temporarily holds the image signal. The memory 2105 may also store the position of a known abnormal pixel in the photoelectric conversion device 2102. The optical distance measuring unit 2106 uses the image signal to perform focusing or distance measurement of an object. The parallax calculator 2107 performs object collation (stereo matching) of a parallax image. The object recognition unit 2108 analyzes image signals to recognize objects such as a transportation equipment, a person, a road sign, a road, and the like. The abnormality detection unit 2109 detects the fault or an error operation of the photoelectric conversion device 2102. When a fault or an error operation has been detected, the abnormality detection unit 2109 transmits a signal indicating the detection of an abnormality to the control device 2113. The external I/F unit 2116 mediates the exchange of information between the units of the image sensing system ASIC 2103 and the control device 2113 or the various kinds of control units.

The transportation equipment 2100 includes a vehicle information acquisition unit 2110 and a driving support unit 2111. The vehicle information acquisition unit 2110 includes vehicle sensors such as a speed/acceleration sensor, an angular velocity sensor, a steering angle sensor, a ranging radar, and a pressure sensor.

The driving support unit 2111 includes a collision determination unit. The collision determination unit determines whether there is a possibility of collision with an object based on the pieces of information from the optical distance measuring unit 2106, the parallax calculator 2107, and the object recognition unit 2108. The optical distance measuring unit 2106 and the parallax calculator 2107 are examples of distance information acquisition units that acquire distance information of a target object. That is, distance information is pieces of information related to the parallax, the defocus amount, the distance to the target object, and the like. The collision determination unit may use one of these pieces of distance information to determine the possibility of a collision. Each distance information acquisition unit may be implemented by dedicated hardware or a software module.

An example in which the driving support unit 2111 controls the transportation equipment 2100 so as to avoid a collision with another object has been described. However, the present invention is also applicable to a case in which automatic driving control for following another vehicle or automatic driving control for preventing the vehicle from drifting out of the lane is performed.

The transportation equipment 2100 also includes driving devices, which are used for movement or for supporting the movement, such as an air bag, an accelerator, a brake, a steering wheel, a transmission, an engine, a motor, wheels, propellers, and the like. The transportation equipment 2100 also includes control units for these devices. Each control unit controls a corresponding driving device based on a control signal of the control device 2113.

The image sensing system used in each embodiment is applicable not only to an automobile and a railroad car but also to, for example, a transportation equipment such as a ship, an airplane, or an industrial robot. In addition, the image sensing system is applicable not only to a transportation equipment but also to an equipment that uses object recognition widely such as an ITS (Intelligent Transportation System).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-228308, filed Nov. 28, 2017, which is hereby incorporated by reference herein in its entirety.

What is claimed is:

1. A photoelectric conversion device, comprising:
a photoelectric converter arranged in a semiconductor substrate made of silicon; and
a transistor arranged on a surface of the semiconductor substrate, wherein
the photoelectric converter includes a first region which is of a first conductivity type and is configured to accumulate charges and a second region of a second conductivity type different from the first conductivity type, and the first region is arranged between the surface and the second region,
the semiconductor substrate includes a third region which functions as a source and/or a drain of the transistor,
the semiconductor substrate includes, in a position which is below the third region and is apart from the third region, an impurity region containing a group 14 element other than silicon, and
a depth from the surface, of a peak position in a density distribution of the group 14 element in the impurity region is smaller than a depth from the surface, of a peak position in a density distribution of a majority carrier in the second region.

2. The device according to claim 1, wherein the transistor includes a gate electrode, and
the impurity region includes a portion arranged below the gate electrode in a direction perpendicular to the surface.

3. The device according to claim 1, wherein a plurality of photoelectric converters including the photoelectric converter are arranged in the semiconductor substrate,
the second region is arranged in common for the plurality of photoelectric converters, and
the impurity region is arranged between the third region and the second region in a direction perpendicular to the surface.

4. The device according to claim 1, wherein a semiconductor region of the second conductivity type is arranged below the third region in the semiconductor substrate, and
the impurity region is arranged in the semiconductor region.

5. The device according to claim 4, wherein the transistor is arranged so as to be sandwiched between two insulator regions in a section perpendicular to the surface,
the semiconductor substrate includes two separation regions of the second conductivity type each of which is arranged below a corresponding one of the two insulator regions in the section, and
the impurity region is arranged between the two separation regions in the section.

6. The device according to claim 5, wherein the maximum density of a majority carrier in the two separation regions is higher than the maximum density of a majority carrier in the semiconductor region.

7. The device according to claim 4, wherein the density of the majority carrier of the second conductivity type in the semiconductor region is not less than $1\times10^{15}$ [atoms/cm$^3$].

8. The device according to claim 1, wherein a fourth region of the first conductivity type is arranged in the semiconductor substrate, and a transfer electrode configured to transfer the charges from the first region to the fourth region is arranged on the semiconductor substrate, and
the impurity region is not arranged below the fourth region and the transfer electrode in a direction perpendicular to the surface.

9. The device according to claim 8, wherein the transistor is one of an amplification transistor, a reset transistor, a selection transistor, and an additional capacitance transistor.

10. The device according to claim 1, wherein the semiconductor substrate includes a pixel section on which the photoelectric converter is arranged and a peripheral circuit section configured to read out a signal from the pixel section, and
the transistor is arranged in the peripheral circuit section.

11. The device according to claim 1, wherein the semiconductor substrate includes a pixel section on which the photoelectric converter and the transistor are arranged, and a peripheral section on the periphery of the pixel section,
the peripheral section includes a semiconductor element, and
the semiconductor substrate includes, below the semiconductor element, a gettering region containing the group 14 element other than silicon.

12. The device according to claim 11, wherein the gettering region is arranged below a well of the semiconductor element.

13. The device according to claim 11, wherein the depth from the surface to the impurity region is the same as the depth from the surface to the gettering region.

14. The device according to claim 11, wherein the depth from the surface to the impurity region is different from the depth from the surface to the gettering region.

15. The device according to claim 11, wherein the transistor contains a silicide, and the semiconductor element contains a silicide of a different metal type than the transistor.

16. The device according to claim 1, wherein the transistor contains a silicide, and the density of the group 14 element in the impurity region is not less than $1\times10^{17}$ [atoms/cm$^3$].

17. The device according to claim 1, wherein the depth from the surface of the peak position of the density of the group 14 element in the impurity region falls within a range of 0.1 μm to 0.5 μm.

18. An equipment comprising:
a photoelectric conversion device defined in claim 1; and
a processing device configured to process a signal output from the photoelectric conversion device.

19. An equipment that includes a driving device, comprising:
a control device which incorporates a photoelectric conversion device defined in claim 1, and is configured to control the driving device based on information obtained by the photoelectric conversion device.

20. A photoelectric conversion device that includes a photoelectric converter arranged in a semiconductor substrate and a transistor arranged on a surface of the semiconductor substrate, wherein
the photoelectric converter includes a first region which is of a first conductivity type and is configured to accumulate charges and a second region of a second conductivity type different from the first conductivity type, and the first region is arranged between the surface and the second region,
the semiconductor substrate includes a third region which functions as a source and/or a drain of the transistor,
the semiconductor substrate includes, in a position which is below the third region and is apart from the third region, an impurity region containing carbon, and
a depth from the surface, of a peak position of a density of the carbon in the impurity region falls within a range of 0.1 μm to 0.5 μm and is smaller than a depth from a peak position, of the peak position of a density of a majority carrier in the second region.

21. A method of manufacturing a photoelectric conversion device that includes a photoelectric converter and a transistor,
the photoelectric converter includes a first region which is of a first conductivity type and is configured to accumulate charges and a second region of a second conductivity type different from the first conductivity type, and the first region is arranged between a surface of a semiconductor substrate and the second region,
the method comprising:
implanting a group 14 element other than silicon to the semiconductor substrate and forming an impurity region containing the group 14 element in the semiconductor substrate; and
forming a third region configured to function as a source or a drain of the transistor in the semiconductor substrate,
wherein the impurity region is arranged in a position which is below the third region and is apart from the third region, and
a depth from the surface, of a peak position of a density of the group 14 element in the impurity region is smaller than a depth from the surface, of a peak position of a density of a majority carrier in the second region.

* * * * *